United States Patent
Sugihara

(10) Patent No.: US 7,823,101 B2
(45) Date of Patent: Oct. 26, 2010

(54) DEVICE, METHOD, AND STORAGE FOR VERIFICATION SCENARIO GENERATION, AND VERIFICATION DEVICE

(75) Inventor: Shizuko Sugihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 425 days.

(21) Appl. No.: 12/016,625

(22) Filed: Jan. 18, 2008

(65) Prior Publication Data

US 2008/0209369 A1    Aug. 28, 2008

(30) Foreign Application Priority Data

Feb. 23, 2007  (JP) ............................. 2007-043839

(51) Int. Cl.
*G06F 17/50*  (2006.01)
(52) U.S. Cl. ................... 716/4; 716/5; 716/6; 714/724; 714/735; 714/738; 714/741; 714/742; 324/763; 324/764; 324/765
(58) Field of Classification Search ................. 716/4–6; 714/724, 735, 738, 741–742; 324/763–765
See application file for complete search history.

(56) References Cited

U.S. PATENT DOCUMENTS

| | | | |
|---|---|---|---|
| 6,490,711 B2 * | 12/2002 | Buckley, Jr. ................... 716/5 |
| 6,654,715 B1 | 11/2003 | Iwashita |
| 7,260,798 B2 * | 8/2007 | Gupta et al. ................... 716/5 |
| 7,454,324 B1 * | 11/2008 | Seawright et al. ............. 703/14 |

FOREIGN PATENT DOCUMENTS

| JP | 2000-181939 | 6/2000 |
|---|---|---|
| JP | 2003-30270 | 1/2003 |
| JP | 2005-196681 | 7/2005 |

\* cited by examiner

*Primary Examiner*—Nghia M Doan
(74) *Attorney, Agent, or Firm*—Staas & Halsey LLP

(57) ABSTRACT

A verification scenario generation device including a first input unit which accepts input of a device list showing devices connected with a circuit to be verified, parameter setting information for the devices, and a test bench combination list corresponding to the devices, a test bench library which holds the test bench, and a test bench generation unit to generate a test bench for verification, a scenario template generation unit which generates a scenario template. The device further includes a data combination list generation unit which generates a combination list of data kinds, a verification item generation unit which generates verification items based on a combination list of the data kind and a combination list of the test bench input, and a verification scenario generation unit which generates a verification scenario based on the scenario template, and the verification items.

16 Claims, 22 Drawing Sheets

FIG. 6

```
-- Library library STD ;
   use STD.standard.all ;
   use STD.textio.all ;
library IEEE ;
   use IEEE.std_logic_1164.all ;
   use IEEE.std_logic_unsigned.all ;
library TBLIB
   use TBLIB.global_record.all;

-- Package package i2c_h is type array8b512    is array(1 to   512) of integer range 0 to 255;

type I2C_AAA_WRITE_INFO is record                    11b
      W_ADD_EXPECT_in  : integer range 0 to 255;
      W_DATA_EXPECT_in : integer range 0 to 255;
   end record;

type I2C_AAA_READ_INFO is record                     11c
      R_ADD_EXPECT_in  : integer range 0 to 255;
      R_DATA_in        : array8b512;
      R_bytelength_in  : integer range 1 to 513;
   end record;

end i2c_h ;

-- Module entity I2C_AAA is
  generic (
    NUM : integer := 0
  );
  port (
      WP    : out   std_logic;
      SCL   : in    std_logic;  --clock line
      SDA   : inout std_logic;  --data I2C_AAA_WRITE_INFO_in: in   I2C_AAA_WRITE_INFO;
      I2C_AAA_READ_INFO_in : in   I2C_AAA_READ_INFO;
      ERRLOGOUT_INFO_in    : in   ERRLOGOUT_INFO
  );
end I2C_AAA;

architecture testbench of I2C_AAA is
   ...
   end process;
end testbench;
```

```
timescale 10 ps / 10 ps
parameter BITWIDTH=32
module DSP0XXP (
    //-- clock & reset
    RST,              // I ansynchronous reset (active high)
    CLKB,             // I CPU clock //-- bus interface
    XA,               // O [31:0] X-bus address
    XRW,              // O [1:0] X-bus R/W
    XSIZE,            // O [1:0] X-bus data-size
    XWAITS,           // O X-bus SDRAM IF wait
    XWAITT,           // O X-bus T-unit wait
    XWAITR,           // O X-bus R-unit wait
    XWAITB,           // O X-bus B-unit wait
    XWAITA,           // O X-bus another wait
    XWAITD,           // I X-bus DMAC wait(read)
    XSLEEP,           // O X-bus sleep
    XDI,              // O [31:0] X-bus data
    XDO,              // I [31:0] X-bus data
    FTEST,            // O X-bus memory test (XD=>HIZ)
    XTEST ,           // O F-bus memory test (XD=>HIZ)
    // --error log display signal
            ERRLOGOUT_DISPLAY
    );

//-----------------------------------------------------------
// Include Files
//-----------------------------------------------------------
`include "dmac_global_defs.v"
//-----------------------------------------------------------
// Functions and Tasks
//-----------------------------------------------------------
//-- Public Functions and Tasks
```

```
task RD;
    input [1:0]        data_size;
    input [BITWIDTH:0] read_address;
    begin
        access_mode_int = RD_MODE;  --- RD_MODE is a parameter
        data_size_int   = data_size;
        address_int     = read_address;
        -> startor_event;
        @ (closer_event);
    end
endtask
```
~12b

```
task RD_VERIFY;
    input [1:0]        data_size;
    input [BITWIDTH:0] read_address;
    input [31:0]       expected_data;
    begin
        access_mode_int   = RD_VERIFY_MODE;  --- RD_VERIFY_MODE is a parameter
        data_size_int     = data_size;
        address_int       = read_address;
        expected_data_int = expected_data;
        -> startor_event;
        @ (closer_event);
    end
endtask
```
~12c

```
task DISPLAY_INFO_MSG_OFF;  --- task having no description of "input" should be ignored.
    begin
        display_info_msg_on = 0;
        $display("\n");
        $display("INFO time %0t PS, Message from %m", $time);
        $display("INFO   Display information message to OFF.");
    end
endtask //-----------------------------------------------------------
// Combinatorial Logic
//-----------------------------------------------------------
always begin
    @ (startor_event);
    ...
end endmodule
```

WHEN TB (TEST BENCH) IS VHDL FILE (I2C_AAA.vhd)

| SEARCH PLACE | SEARCH WORD | | EXTRACTION WORD 14a | | |
|---|---|---|---|---|---|
| package | DEVICE NAME & record | record type | SIGNAL NAME | TYPE | BIT WIDTH |
| I2C_AAA.vhd | type I2C_AAA_WRITE_INFO is record | I2C_AAA_WRITE_INFO | W_ADD_EXPECT_in | integer | 0 to 255 |
| | | | W_DATA_EXPECT_in | integer | 0 to 255 |
| I2C_AAA.vhd | type I2C_AAA_READ_INFO is record | I2C_AAA_READ_INFO | R_ADD_EXPECT_in | integer | 0 to 255 |
| | | | R_DATA_in | array8b512 | — |
| | | | R_bytelength_in | integer | 1 to 512 |

FIG. 10

WHEN TB (TEST BENCH) IS verilog FILE (DSP0XXP.v)

| SEARCH PLACE IN TB | SEARCH WORD task | | EXTRACTION WORD | | |
|---|---|---|---|---|---|
| | | task NAME | SIGNAL NAME | BIT WIDTH | |
| DSP0XXP.v | task RD; | RD | data_size | [1:0] | |
| | | | read_address | [31:0] | |
| DSP0XXP.v | task RD_VERIFY; | RD_VERIFY | data_size | [1:0] | |
| | | | read_address | [31:0] | |
| | | | expected_data | [31:0] | |

| record type/task NAME | DEFINITION NAME IN SCENARIO (TC) | SIGNAL 1 | SIGNAL 2 | SIGNAL 3 |
|---|---|---|---|---|
| I2C_AAA_WRITE_INFO | TB_TOP.TB_I2C_AAA_WRITE_INFO | W_ADD_EXPECT_in | W_DATA_EXPECT_in | |
| | | 0 | 0 | |
| | | ... | ... | |
| | | 0 | 255 | |
| | | 1 | 0 | |
| | | ... | ... | |
| | | 1 | 255 | |
| | | ... | ... | |
| | | 255 | 255 | |
| I2C_AAA_READ_INFO | TB_TOP.TB_I2C_AAA_READ_INFO | R_ADD_EXPECT_in | R_DATA_in | R_bytelength_in |
| | | 0 | array8b512==all'0' | 1 |
| | | ... | ... | ... |
| | | 0 | array8b512==all'0' | 512 |
| | | 1 | array8b512==all'1' | 1 |
| | | ... | ... | ... |
| | | 1 | array8b512==all'1' | 512 |
| | | ... | ... | ... |
| | | 255 | array8b512==all'1' | 512 |
| RD | TB_TOP.TB_DSP0XXPRD | data_size | read_address | |
| | | 2'b00 | 32'h0 | |
| | | ... | ... | |
| | | 2'b00 | 32'hFFFFFFFF | |
| | | 2'b01 | 32'h0 | |
| | | ... | ... | |
| | | 2'b01 | 32'hFFFFFFFF | |
| | | ... | ... | |
| | | 2'b11 | 32'hFFFFFFFF | |
| RD_VERIFY | TB_TOP.TB_DSP0XXPRD_VERIFY | data_size | read_address | |
| | | 2'b00 | 32'h0 | |
| | | ... | ... | |
| | | 2'b00 | 32'h0 | |
| | | 2'b00 | 32'h1 | |
| | | ... | ... | |
| | | 2'b00 | 32'h1 | |
| | | ... | ... | |
| | | 2'b11 | 32'hFFFFFFFF | |

FIG. 12

| No. | EVENT 1 | EVENT 2 |
|---|---|---|
| 1 | I2C_AAA_WRITE_INFO | |
| 2 | I2C_AAA_WRITE_INFO | I2C_AAA_READ_INFO |
| 3 | I2C_AAA_READ_INFO | I2C_AAA_WRITE_INFO |
| 4 | RD | |
| 5 | RD | RD_VERIFY |
| 6 | RD_VERIFY | RD |
| 7 | I2C_AAA_WRITE_INFO | RD_VERIFY |

Table 15a:

| No. | EVENT 1 | EVENT 2 | | | |
|---|---|---|---|---|---|
| 1 | I2C_AAA_WRITE_INFO | | | | |
| | | | No. | W_ADD_EXPECT_in | W_DATA_EXPECT_in |
| | | | 1 | 0 | 0 |
| | | | ... | ... | ... |
| | | | 256 | 255 | 0 |
| | | | 257 | 0 | 1 |
| | | | ... | ... | ... |
| | | | 65536 | 255 | 255 |
| 2 | I2C_AAA_WRITE_INFO | I2C_AAA_READ_INFO | | | |
| | | | No. | W_ADD_EXPECT_in | W_DATA_EXPECT_in |
| | | | 1 | 0 | 0 |
| | | | ... | ... | ... |
| | | | 256 | 255 | 0 |
| | | | 257 | 0 | 1 |
| | | | ... | ... | ... |
| | | | 65536 | 255 | 255 |
| 3 | I2C_AAA_READ_INFO | I2C_AAA_WRITE_INFO | | | |
| 4 | RD | RD_VERIFY | | | |
| 5 | RD | RD | | | |
| 6 | RD_VERIFY | I2C_AAA_WRITE_INFO | | | |
| 7 | I2C_AAA_WRITE_INFO | RD_VERIFY | | | |

Table 15a':

| No. | R_ADD_EXPECT_in | R_DATA_in | R_bytelength_in |
|---|---|---|---|
| 1 | 0 | array8b512=='all'0' | 1 |
| ... | ... | ... | ... |
| 256 | 0 | array8b512=='all'0' | 512 |
| 257 | 1 | array8b512=='all'1' | 1 |
| ... | ... | ... | ... |
| | 1 | array8b512=='all'1' | 512 |
| n | 255 | array8b512=='all'1' | 512 |

| record type/task NAME | DEFINITION NAME IN SCENARIO (TC) | SIGNAL 1 | SIGNAL 2 | SIGNAL 3 |
|---|---|---|---|---|
| I2C_AAA_WRITE_INFO | TB_TOP.TB.TB_I2C_AAA_WRITE_INFO | W_ADD_EXPECT_in | W_DATA_EXPECT_in | |
| | | 0 | 0 | |
| | | ... | ... | |
| | | 0 | 255 | |
| | | 1 | 0 | |
| | | ... | ... | |
| | | 1 | 255 | |
| | | ... | ... | |
| | | 255 | 255 | |
| I2C_AAA_READ_INFO | TB_TOP.TB.TB_I2C_AAA_READ_INFO | R_ADD_EXPECT_in | R_DATA_in | R_bytelength_in |
| | | 0 | array8b512=='all'0' | 1 |
| | | ... | ... | ... |
| | | 0 | array8b512=='all'0' | 512 |
| | | 1 | array8b512=='all'1' | 1 |
| | | ... | ... | ... |
| | | 1 | array8b512=='all'1' | 512 |
| | | ... | ... | |
| | | 255 | array8b512=='all'1' | 512 |
| RD | TB_TOP.TB.TB_DSP0XXPRD | data_size | read_address | |
| | | 2'b00 | 32'h0 | |
| | | ... | ... | |
| | | 2'b00 | 32'hFFFFFFFF | |
| | | 2'b01 | 32'h0 | |
| | | ... | ... | |
| | | 2'b01 | 32'hFFFFFFFF | |
| | | ... | ... | |
| | | 2'b11 | 32'hFFFFFFFF | |
| RD_VERIFY | TB_TOP.TB.TB_DSP0XXPRD_VERIFY | data_size | read_address | expected_data |
| | | 2'b00 | 32'h0 | 32'h0 |
| | | ... | ... | ... |
| | | 2'b00 | 32'hFFFFFFFF | 32'hFFFFFFFF |
| | | 2'b00 | 32'h0 | 32'h0 |
| | | ... | ... | ... |
| | | 2'b00 | 32'h1 | 32'h1 |
| | | ... | ... | ... |
| | | 2'b11 | 32'hFFFFFFFF | 32'hFFFFFFFF |

DEVICE, METHOD, AND STORAGE FOR VERIFICATION SCENARIO GENERATION, AND VERIFICATION DEVICE

CROSS-REFERENCE TO RELATED APPLICATIONS

This application is related to and claims the benefit of priority from Japanese Patent Application No. 2007-43839, filed on Feb. 23, 2007, the entire contents of which are incorporated herein by reference.

BACKGROUND

1. Field

This invention relates to a device, method, medium for verification scenario generation that is used in verification.

2. Description of the Related Art

Logic verification using which verification of whether an integrated circuit is normally operated is indispensable for designing the integrated circuit (for example, a large scale integrated circuit (LSI)). The logic verification is also important in order to keep high quality of, especially, the LSI for which a larger scale, a higher functionality, a higher speed, and a lower power consumption is generally required. On the other hand, a higher efficiency in working has been required by a shorter design period for the LSI in a conventional manner.

A typical verification system for an integrated circuit will be explained, referring to FIG. 20. Review information 103 and verification property (assertion group) 104 are made from specifications 101 for a circuit to be verified by conversion processing 102 based on manual operation by an operator (for example a designer) in a verification system 100 while the specifications 101 is made by the operator. Then, the operator may review the specification 101 by feeding back the review information 103 thereto.

Moreover, the logic verification of the circuit to be verified is performed by a verification unit 107, based on the verification property 104 obtained by the conversion processing 102 based on manual operation by the operator, a verification scenario (verification environment scenario) 105, and circuit information 106 on the circuit to be verified.

However, a verification environment of verification items and the verification scenario 105, and the like, which are required for logic verification of an integrated circuit, have been typically made from a specification described in a natural language, based on manual operation by an operator performing logic verification.

Accordingly, a more complicated function, and a more highly integrated structure of integrated circuits have recently required a huge amount of man-hours as a result of manual operations of the operator, thereby putting an enormous load on the operator. Moreover, there has been often cases in which remaking or repeating of the verification scenario is necessary due to elimination of or errors in verification items and the like, where the elimination and the errors are caused by manual operations of the operator. When the verification scenario is remade, a longer design period, and a higher cost for development of the integrated circuit are required.

Accordingly, reduced man-hours of manual operations by the operator, a lighter load on the operator, and, at the same time, need for less remaking of the verification scenario are subjects to be pursued.

Considering the above discussed and other existing problems, the present invention has been developed to reduce the load put on an operator, and, at the same time, reduce a time required for making a verification scenario when the verification scenario used for logic verification of an integrated circuit is made.

SUMMARY

The disclosed verification scenario generation device includes a first input unit which accepts input of a device list indicating devices connected with a circuit to be verified, parameter setting information of the devices, and a test bench combination list corresponding to the devices, and a test bench library which holds the test bench.

The device includes a test bench generation unit for verification by which a test bench is read from the test bench library based on the device list and the parameter setting information input to generate a test bench for verification, a scenario template generation unit which generates a scenario template in which initial setting information for the test bench for verification is described, a data combination list generation unit which generates a combination list of data kinds related to the test bench for verification, a verification item generation unit which generates verification items based on a combination list of the data kind generated by the data combination list generation unit and a combination list of the test bench input, and a verification scenario generation unit which generates a verification scenario based on the scenario template generated, and the verification items generated.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 6 shows one example illustrating a test bench held by a test bench library of a verification device according to the embodiment of the invention;

FIG. 7 shows one example illustrating a test bench generated by a test bench generation unit of a verification device according to the embodiment of the invention;

FIG. 8 shows one example illustrating a scenario template generated by a scenario template generation unit of a verification device according to the embodiment of the invention;

FIG. 9 shows one example illustrating a list for a data combination list generated by a data combination list generation unit in a verification device according to the embodiment of the invention;

FIG. 10 shows one example illustrating a list for a data combination list generated by a data combination list generation unit in a verification device according to the embodiment of the invention;

FIG. 11 shows one example illustrating a data combination list generated by a data combination list generation unit in the verification device according to the embodiment of the invention;

FIG. 12 shows one example of a test bench combination list the input of which is accepted by a first input unit of a verification device according to the embodiment of the invention;

FIG. 13 shows one example illustrating verification items generated by a verification item generation unit in a verification device according to the embodiment of the invention;

FIG. 14 shows one example illustrating a scenario generated by a scenario generation unit in a verification device according to the embodiment of the invention;

FIG. 17 shows one example illustrating a data combination list generated by a data combination list generation unit in a verification device according to the first modification of the invention;

DETAILED DESCRIPTION OF THE PREFERRED EMBODIMENTS

Figure 1:
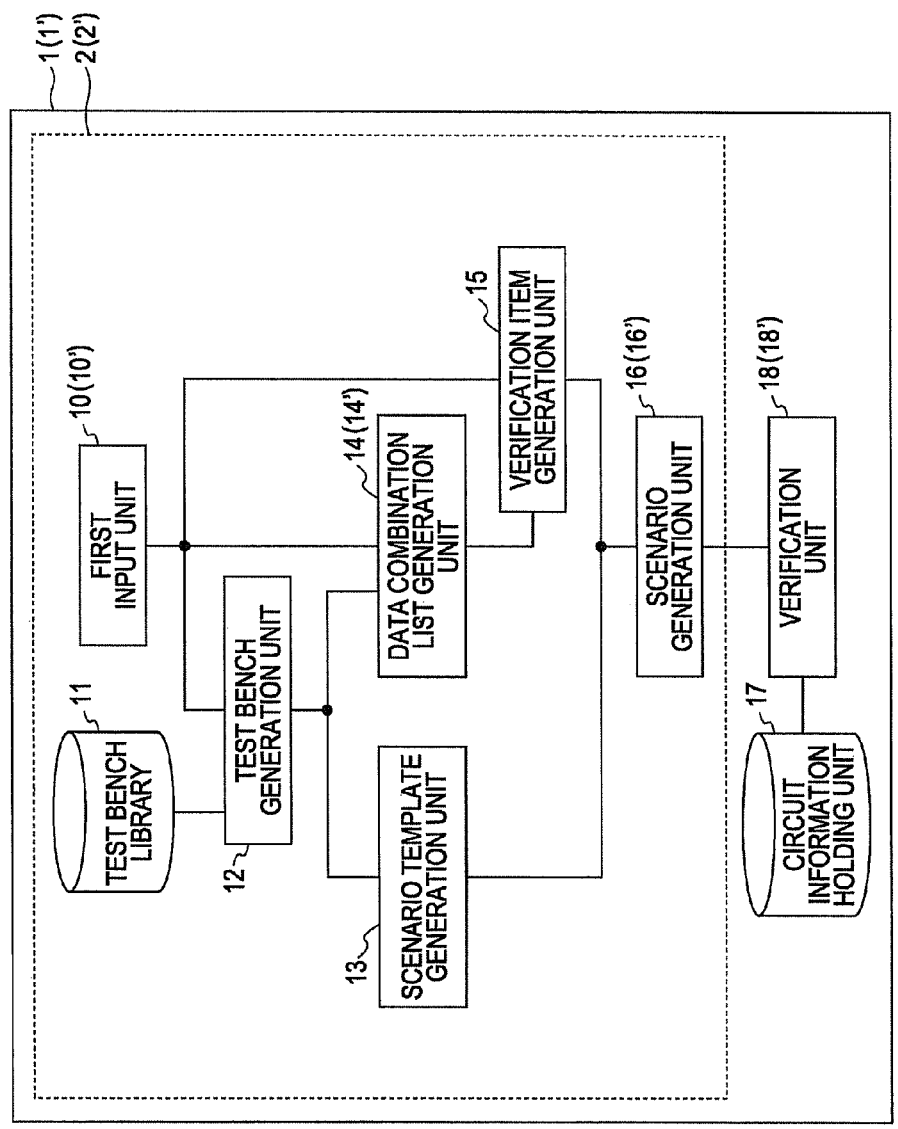
FIG. 1 shows a block diagram illustrating a verification device according to one embodiment of the present invention.

Reference will now be made in detail to the embodiments, examples of which are illustrated in the accompanying drawings, wherein like reference numerals refer to the like elements throughout. The embodiments are described below to explain the present invention by referring to the figures.

First, an exemplary configuration of a verification device 1 will be explained with reference to a block diagram shown in FIG. 1. As shown in FIG. 1, the verification device 1 is provided with a first input unit 10, a test bench library 11, a test bench generation unit (a test bench generation unit for verification, assertion group generation unit) 12, a scenario template generation unit 13, a data combination list generation unit 14, a verification item generation unit 15, a scenario generation unit (verification scenario generation unit) 16; a circuit information holding unit 17, and a verification unit (assertion verification unit) 18.

Here, the first input unit 10, the test bench library 11, the test bench generation unit 12, the scenario template generation unit 13, the data combination list generation unit 14, the verification item generation unit 15, and the scenario generation unit 16 of the verification device 1 operate as a verification scenario generation device (verification auxiliary (support) device, which hereinafter, may be referred to as a verification scenario generation device 2.

Figure 2:
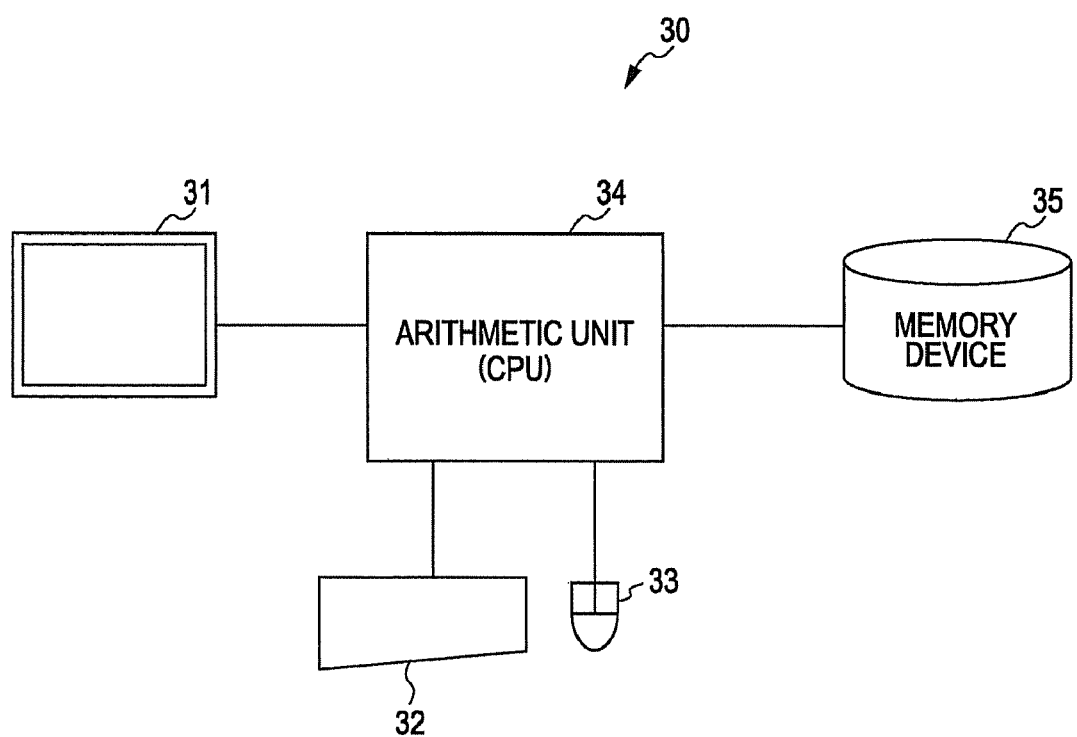
FIG. 2 shows a block diagram illustrating a computer realizing the verification device according to the embodiment of the invention.

The verification device 1 may be realized by a computer 30 provided with an arithmetic unit (for example, central processing unit (CPU)) 34, with which a monitor 31, a keyboard 32, and a mouse 33 are connected, and a storage (memory) device 35 connected with the arithmetic unit 34 as shown in FIG. 2.

That is, the test bench generation unit 12, the scenario template generation unit 13, the data combination list generation unit 14, the verification item generation unit 15, the scenario generation unit 16, and the verification unit 18 are realized by a configuration in which a predetermined application program (for example, a verification scenario generation program or a verification program described in detail below) is executed by the arithmetic unit 34. The test bench library 11 and the circuit information holding unit 17 may be realized by the storage device 35 in the computer 30. Here, it is acceptable to realize the test bench library 11 and the circuit information holding unit 17 by memories (not shown) provided in the arithmetic unit 34.

Moreover, the first input unit 10 may be realized by the keyboard 32 and the mouse 33 as an input interface, and an input control unit (not shown), which receives an input from the keyboard 32 and the mouse 33, in the arithmetic unit 34.

The verification scenario generation device 2 automatically generates a verification scenario (a group of scenarios, hereinafter, simply referred to as a scenario) used for logic verification of a circuit (for example, LSI) to be verified, based on information (for example, a device list, a parameter setting information, a list of combinations among test benches, all of which will be described) received as an input by the first input unit 10, and the verification device 1 performs logic verification of the circuit to be verified, using the verification scenario which has been automatically generated.

Here, logic verification executed by the verification device 1 will be explained, referring to a flow diagram (operations S1 to S9) illustrating processing procedure(s) of a method of manufacturing an integrated circuit, shown in FIG. 3.

Logic verification (operation S4) of the integrated circuit (circuit to be verified) is executed after an operator (designer) makes a specification (operation S1), and logic design is completed (operation S2), and before the processing proceeds to physical design (operation S5). Then, it is verified whether the circuit to be verified is normally operated or not after the logic design of the circuit to be verified is completed.

That is, after completing the logic design (operation S2), the operator builds a logic verification environment (for example, verification items are decided, and the verification scenario is generated) (operation S3) to execute the logic verification (operation S4).

When it is verified that the circuit to be verified is normally operated, the operator subsequently performs physical design (actual layout) (operation S5).

After the physical design (operation S5) is completed, the operator performs physical verification (operation S6). When a normal result is obtained at the operation S6, the circuit to be verified is manufactured (operation S9) after an operation (operation S7) of prototype manufacturing of the circuit to be verified, and an operation (operation S8) of prototype testing.

Figure 3:
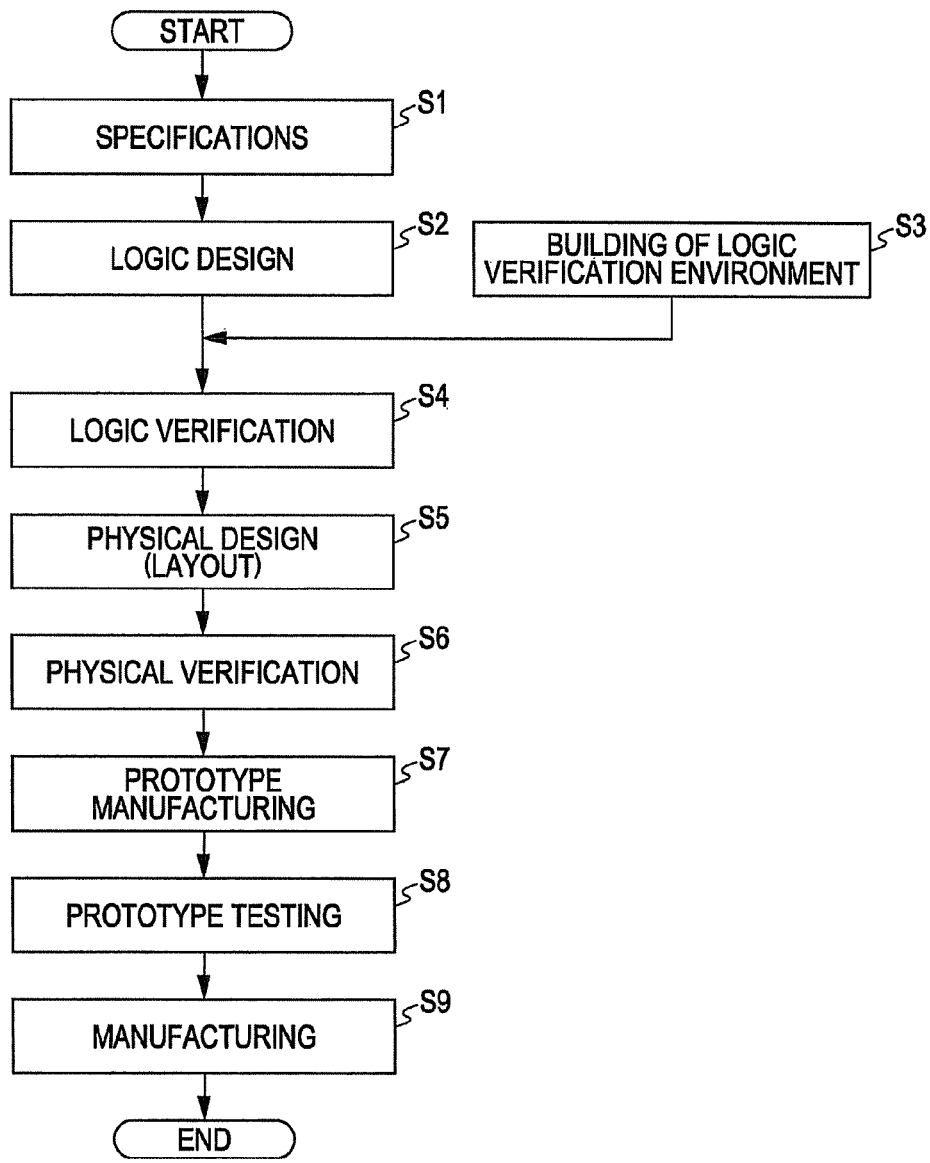
FIG. 3 shows an exemplary method of manufacturing an integrated circuit to which logic verification by the verification device according to the embodiment of the invention is applied.

That is, the method of manufacturing the integrated circuit shown in FIG. 3 includes logical verification (operation S4) using the verification device 1. Furthermore, the method includes verification scenario generation (building the logic verification environment; refer to operation S3) using the verification scenario generation device 2.

Figure 4:
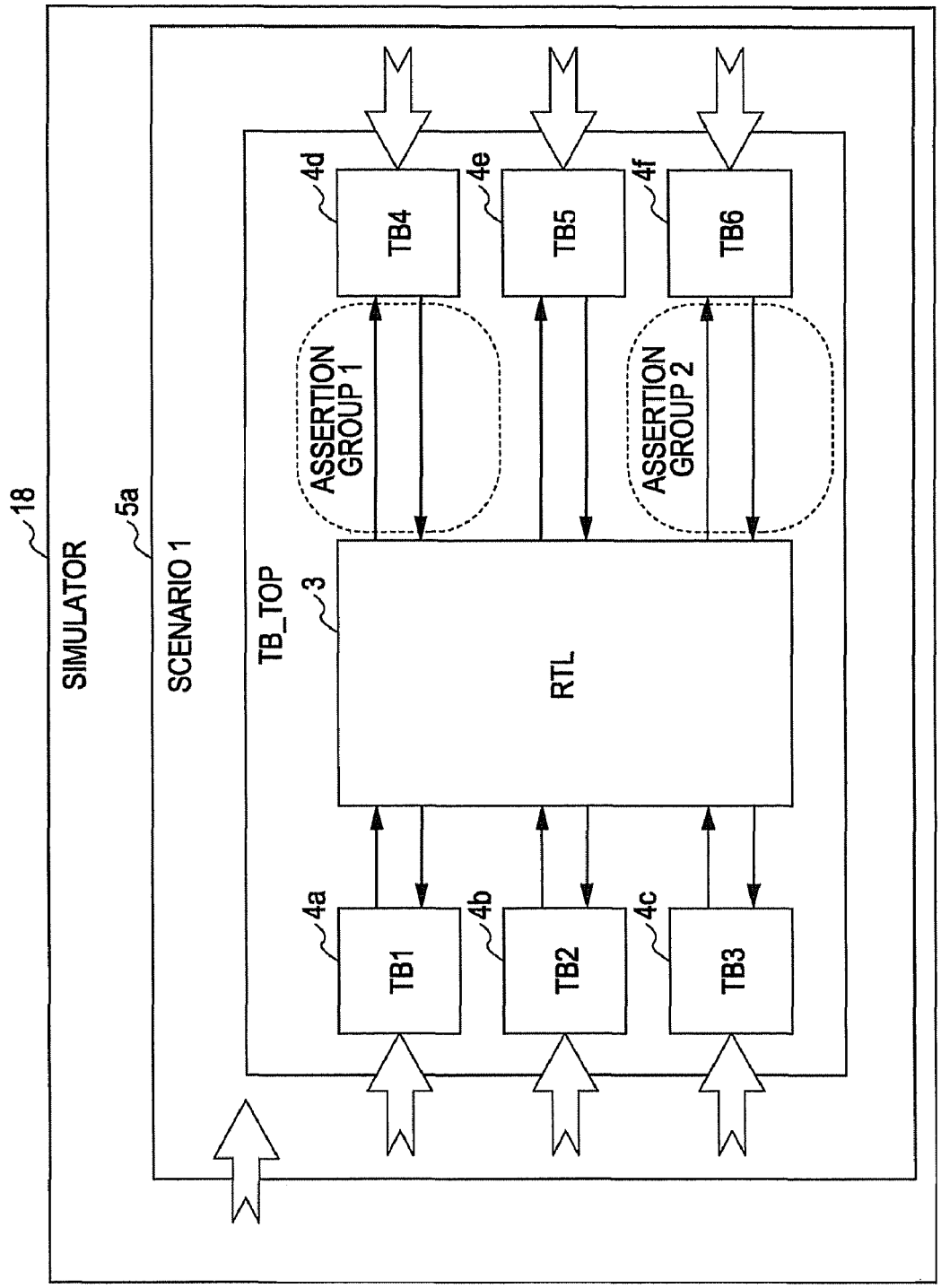
FIG. 4 shows an exemplary a method for logic verification using a verification device according to the embodiment of the invention.

In the logic verification by the verification device 1, test benches "TB1 to TB6" 4a to 4f virtually representing a device connected with the above circuit to be verified 3 are prepared, as shown in FIG. 4, in the test bench generation unit 13 when a register transfer level circuit (RTL) 3 as a circuit to be verified is verified. Moreover, the verification unit 18 as a simulator executes a simulation, based on a scenario, for example, ("scenario 1" 5a in FIG. 4 generated in the scenario generation unit 16. Then, it is verified whether the circuit to be verified is normally operated or not.

Moreover, the verification unit 18 of the verification device 1 may also perform assertion verification (property verification) as logic verification, in addition to the above-described simulation, where the assertion verification uses assertion groups (for example, "assertion groups 1 and 2" in FIG. 1), which are held in the test bench library 11, and are extracted by the test bench generation unit 12.

Figure 5:
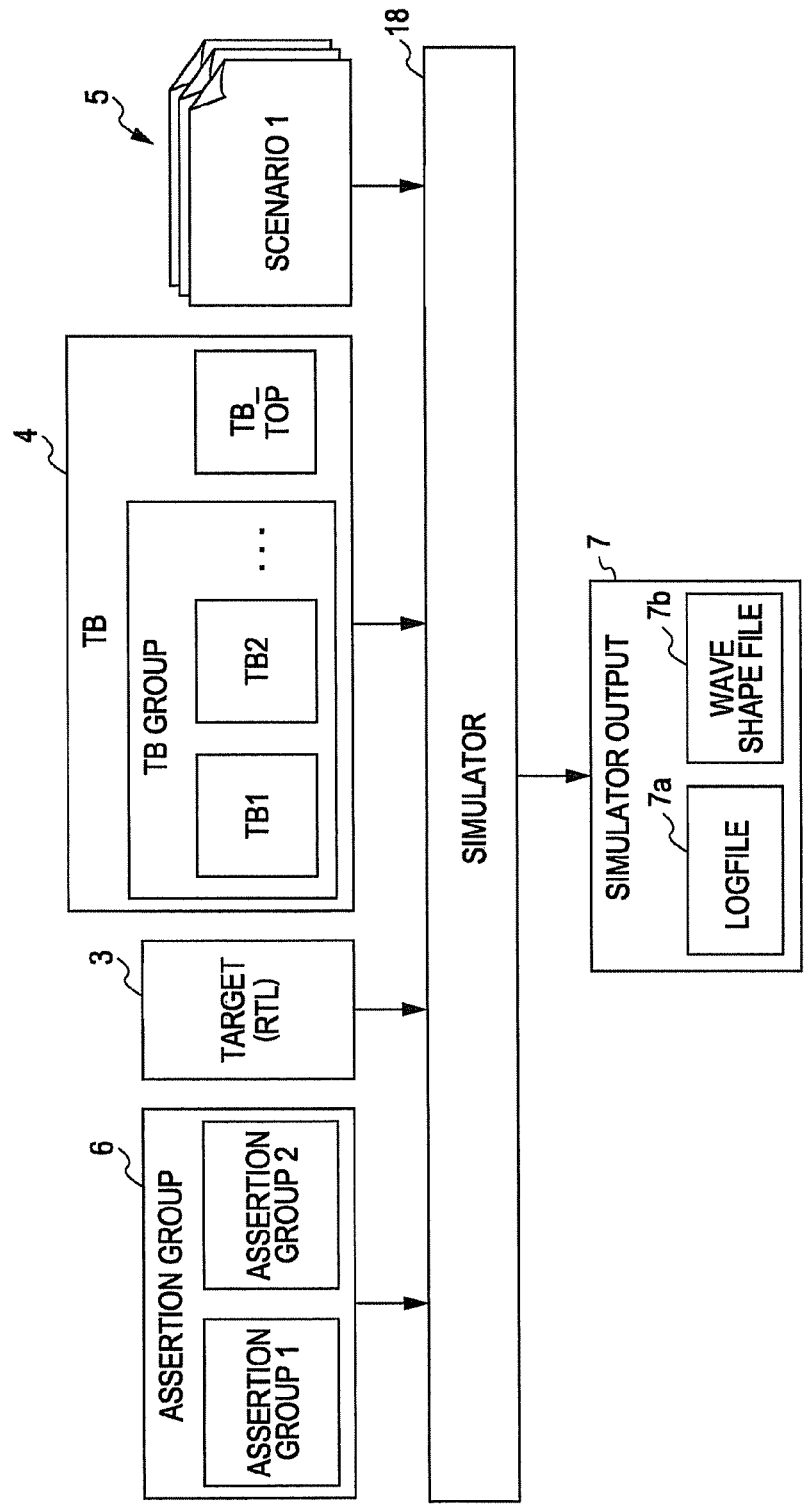
FIG. 5 shows one example of information generated by a verification device according to the embodiment of the invention.

Accordingly, a test bench TB group including TB1, TB2, and the like, and TB_TOP 4 (FIG. 4) is generated by the test bench generation unit 12, and a scenario group 5 is generated by the scenario generation unit 16, and, furthermore, an assertion group 6 is generated by the test bench generation unit 12, as shown in FIG. 5.

Then, the above pieces of generated information, and circuit information "Target (RTL)" 3 (FIG. 4) on the circuit to be verified are input to the verification unit 18 as a simulator, where the circuit information is held in the circuit information holding unit 17. Then, a simulator output 7 including a log file 7a and a wave shape file 7b is output as a simulation result from the verification unit 18.

Now, each of components 10 to 18 of the verification device 1 will be explained in detail, referring to FIG. 1.

The first input unit 10 accepts or receives inputs of a device list showing other electronic components (devices) connected with the circuit to be verified, parameter setting information setting parameters for the above devices, and a list of combinations among test benches corresponding to each device. The device list, the parameter setting information, and the list of combinations among the test benches are accepted, when, for example, the operator inputs the device list, the parameter setting information, and the list of combinations among the test benches by operating keyboard 32 and the mouse 33, shown in FIG. 2.

Here, the device list may include model numbers, etc. of the devices, which specify a test bench held in the test bench library 11.

Moreover, the parameter setting information is set values of the parameters related to each device included in the device list. The values are, for example, the number of clocks set in a parameter CLOCKGEN.v, frequencies of the above clocks, and a data bit width and an address area set in a parameter DSP0XXP.cpp.

Furthermore, the list of combinations among test benches (hereinafter, referred to as a test bench combination list) is information indicating combinations among the test benches for deciding (determining) the verification items. Here, the details of the test bench combination list will be explained below in detail with explanation of the verification item generation unit 15, referring to FIG. 12.

Here, the test bench may be a virtual device representing a device connected with the circuit to be verified where the device is used for simulation of logic verification as described above.

Moreover, a plurality of test benches which may be connected with the circuit to be verified are held beforehand in the test bench library 11.

Specifically, the test bench library 11 holds a test bench 11a shown in FIG. 6. The test bench 11a shown in FIG. 6 is a test bench of an inter-integrated circuit (I2C) (here, the model number "I2C_AAA") described in VHSIC Hardware Description Language (VHDL). Here, ranges denoted by symbols 11b and 11c in the test bench 11a indicate functional blocks set for each scenario made by the scenario generation unit 16.

Moreover, the test bench library 11 holds, other than a plurality of the test benches; assertion groups corresponding to the plurality of the test benches. Here, the assertion (property) verifies whether the circuit to be verified is operated according to the specification described in assertion.

The test bench generation unit 12 reads test benches from the test bench library 11, based on the device list and the parameter setting information accepted as an input by the first input unit 10, to generate the test benches for the verification.

Specifically, the test bench generation unit 12 reads the test benches corresponding to the devices, which the device list shows, from the test bench library 11, and the test benches for verification are generated by setting the parameters of the read test benches, based on the parameter setting information.

For example, the first input unit 10 accepts an input of the model number "DSP0XXP" for a digital signal processor (DSP) as a device list, and, at the same time, that of "parameter BITWIDTH=32" as parameter setting information. Then, the test bench generation unit 12 reads a test bench for the DSP with a model number "DSP0XXP" from the test bench library 11, and generates, for example, a test bench 12a for verification shown in FIG. 7 by setting the parameter of the read test bench, based on the parameter setting information. Here, the test bench 12a for verification is described in a hardware description language (verilog-HDL).

Moreover, in the test bench 12a for verification, a description of "parameter BITWIDTH=32" in the second line from the top, a description of "input [BITWIDTH:0]" in the third line from the top within the range shown by a symbol 12b, and a description of "Input [BITWIDTH:0]" in the third line from the top within the range shown by a symbol 12c are a portion set on the basis of parameter setting information of "parameter BITWIDTH=32". Here, the ranges shown by the symbols 12b and 12c represents functional blocks set for each scenario which is made by the scenario generation unit 16.

Moreover, the test bench generation unit 12 extracts assertion groups related to test benches corresponding to a device included in the above device list from the test bench library 11, based on the device list accepted as an input by the first input unit 10.

That is, the test bench generation unit 12 reads the assertion groups from the test bench library 11, based on the above device list and the above parameter setting information, which are accepted as an input by the first input unit 10. Then, the test bench generation unit 12 functions as the assertion group generation unit generating the assertion groups corresponding to the test benches for verification.

The scenario template generation unit 13 generates a scenario template in which initial setting information for a test bench for verification is described, where the test bench for verification is generated by the test bench generation unit 12.

Incidentally, the test benches corresponding to signals used for one function are brought together into one family, and, as shown in FIG. 6 and FIG. 7, the families are separately declared as, for example, a declaration of record_type (VHDL; refer to FIG. 6), a declaration of task (verilog; refer to FIG. 7), and the like according to functions, where the test benches are held in the test bench library 11.

Figure 8:
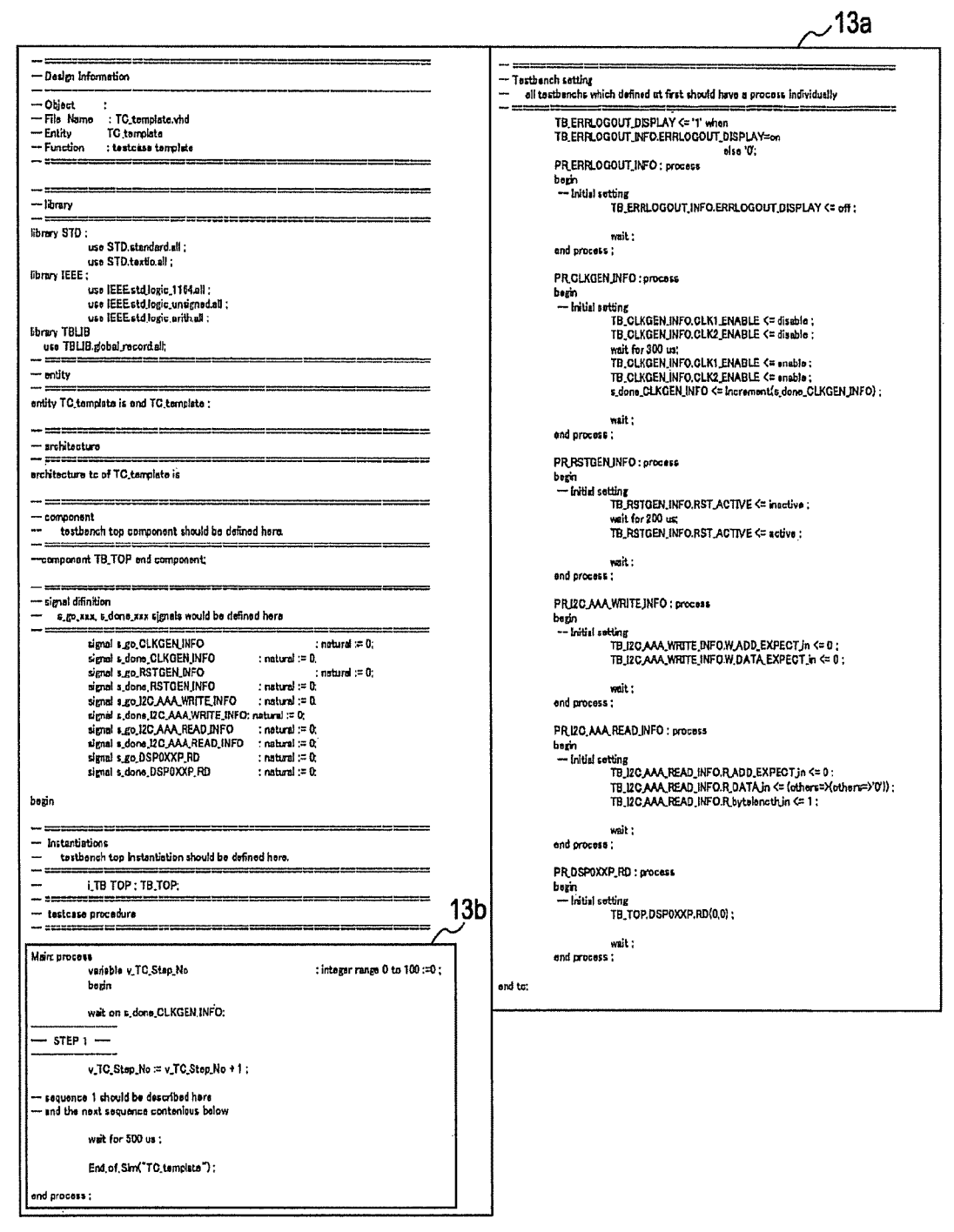

Then, the scenario template generation unit 13 generates a template 13a of a scenario in which initial values for all declarations of record_type and those of all declarations of a task are declared, based on the test benches for verification generated by the test bench generation unit 12, as shown in FIG. 8.

Here, a range shown by a symbol 13*b* in the scenario template 13*a* is a part in which a scenario is set. As the scenario template 13*a* generated by the scenario template generation unit 13 is a template, concrete processing is not set in the above range 13*b*.

The data combination list generation unit 14 generates a list of combinations among data kinds (hereinafter, referred to as a data combination list) for test benches for verification which are generated by the test bench generation unit 12.

The data combination list generated by the data combination list generation unit 14 is a list of all combinations among all signals of each test bench for verification (that is, a list of all combinations among all signals in each of function units), where the test benches are generated by the test bench generation unit 12, and the data combination list is used for automatic generation of an signal input to the circuit to be verified.

In the first place, the data combination list generation unit 14 extracts names, signal names, types of signals, bit widths, etc. according to functions required to be set for each of the test benches for verification, which are generated by the test bench generation unit 12, based on model numbers and reserved words (record/task and the like), as shown in FIG. 9 and FIG. 10.

A list 14*a* shown in FIG. 9 illustrates extracted results of the test benches of I2C with a model number of "I2C_AAA", and the device name or record as a search word is "type I2C_AAA_WRITE_INFO is record" and, "type I2C_AAA_READ_INFO is record".

Then, the record_type of "type I2C_AAA_WRITE_INFO is record" is "I2C_AAA_WRITE_INFO", and signals at this time are the following two kinds: "W_ADD_EXPECT_in" and "W_DATA_EXPECT_in". Here, both of the above signals "W_ADD_EXPECT_in" and "W_DATA_EXPECT_in" are of an "integer" type, and have a bit width of 0 to 255 bits.

On the other hand, the record_type of "type I2C_AAA_READ_INFO is record" is "I2C_AAA_READ_INFO", and signals at this time are the following three kinds: "R_ADD_EXPECT_in", "R_DATA_in", and "R_bytelength_in". Here, the signal "R_ADD_EXPECT_in" is of an "integer" type, and has a bit width of 0 to 255 bits. The signal "R_DATA_in" is of a "array8b512" type. The signal "R_bytelength_in" is of an "integer" type, and has a bit width of 1 to 512 bits.

Moreover, a list 14*b* shown in FIG. 10 illustrates extracted results of the test benches of DSP with a model number of "DSP0XXP". The task name as a search word is "task RD" and "task RD_VERIFY".

Then, the task name of "task RD" is "RD", and signals at this time are the following two kinds: "data_size" and "read_address". Here, the bit width of the signal "data_size" is "[1:0]". The bit width of the signal "read_address" is "[31:0]".

On the other hand, the task name of "task RD_VERIFY" is "RD_VERIFY". The signals at this time are the following three kinds: "data_size", "read_address", and, "expected_data". Here, the bit width of the signal "data_size" is "[1:0]". The bit widths of the signals "read_address" and "expected_data" are "[31:0]".

Here, it is acceptable to adopt a configuration in which the lists 14*a* and 14*b* are not automatically generated by the data combination list generation unit 14, but are prepared by an operator beforehand.

Then, the data combination list generation unit 14 generates a list of all combinations among all acquirable signals as a data combination list 14*c* for each extracted record_type and task name as shown in FIG. 11, based on the lists 14*a* and 14*b* as the above extracted results. Here, the data combination list generation unit 14 defines definition names according to verification scenarios for each record_type and task name in the data combination list 14*c*.

Specifically, the data combination list generation unit 14 generates a list of all combinations between the signal "W_ADD_EXPECT_in" and that "W_DATA_EXPECT_in", assuming that, for example, the definition name of the record_type "I2C_AAA_WRITE_INFO" is "TB_TOP.TB_I2C_AAA_WRITE_INFO". Here, as the signals "W_ADD_EXPECT_in" and "W_DATA_EXPECT_in" have a bit width of 0 to 255, the data combination list generation unit 14 generates signal combinations of 65536 kinds of signals for the square of 256.

In a similar manner to the above, the data combination list generation unit 14 generates all combination lists of signals of "R_ADD_EXPECT_in", "R_DATA_in", and "R_bytelength_in", assuming that the definition name of record_type "I2C_AAA_READ_INFO" is a "TB_TOP.TB_I2C_AAA_READ_INFO". Moreover, assuming that the definition name of a task name "RD" is "TB_TOP.TB_DSP0XXPRD", a list of all combinations of signals of "R_ADD_EXPECT_in", "R_DATA_in", and "R_bytelength_in" are generated.

Moreover, the data combination list generation unit 14 generates all the combination lists of a signal "data_size" and a signal "read_address", assuming that the definition name is as "TB_TOP.TB_DSP0XXPRD_VERIFY" for the task name "RD_VERIFY". Here, the data combination list generation unit 14 includes a signal of "expected_data" indicating an expectation value into the data combination list only when a first input unit 10' (refer to FIG. 1) of a verification device 1' described in detail below accepts input of the test bench expectation value list.

The verification item generation unit 15 generates verification items, based on a data combination list generated by the data combination list generation unit 14 and on the test bench combination list the input of which is accepted by the first input unit 10.

Here, FIG. 12 shows a test bench combination list 10*a* input by the first input unit 10. As shown in FIG. 12, the test bench combination list 10*a* input by an operator is a combination of test benches corresponding to devices (here, a combination of test benches I2C of model number "I2C_AAA" and DSP of model number "DSP0XXP") in the device list. Then, combinations of each process (noted as an event in the drawing) are input as a test bench combination list 10*a*, by record_type declaration and the task declaration of each test bench in the lists 14*a* and 14*b* extracted by the data combination list generation unit 14.

Here, the test bench combination list 10*a* specifies a plurality of combinations (Refer to "No. 1-No. 7" in the drawing). A "No. 1" combination is only "I2C_AAA_WRITE_INFO" as an event of "I2C_AAA", and a "No. 2" combination is a combination of "I2C_AAA_WRITE_INFO" and "I2C_AAA_READ_INFO", which are events of "I2C_AAA". Here, an event is specified for each combination of "No. 3-7" as shown in FIG. 12

The number of combinations included in the test bench combination list, and the number of events at each combination are not limited.

Further, the verification item generation unit 15 generates all combinations between combinations of the test bench combination list 10*a* and the combinations of data combination list 14*c*. Thereby, verification items 15*a* shown in FIG. 13 are generated.

That is, the verification item generation unit 15 generates a verification item, based on the data combination list 14c, for combinations consisting only "I2C_AAA_WRITE_INFO" as a "No. 1" event in a test bench combination list 10a. Specifically, 65536 kinds, that is, square of 256 kinds, of verification items are generated because each of a signal "W_ADD_EXPECT_in" and a signal "W_DATA_EXPECT_in" has 256 kinds of 0 to 255, where each signal of "W_ADD_EXPECT_in" and that of "W_DATA_EXPECT_in" are for an event "I2C_AAA_WRITE_INFO".

Moreover, the verification item generation unit 15 generates all combinations of signals, "W_ADD_EXPECT_in" and "W_DATA_EXPECT_in", which an event "I2C_AAA_WRITE_INFO" can take, and signals, "R_ADD_EXPCT_in", "R_DATA_in", and "R_byte-length_in" which an event "I2C_AAA_read_info" can take, as verification items for a combination of "I2C_AAA_WRITE_INFO", and "I2C_AAA_READ_INFO" as an "No. 2" event in the test bench combination list 10a.

That is, as shown in FIG. 13, one kind-n kinds of combinations, by which all the combinations signals, "R_ADD_EXPECT_in", "R_DATA_in" and, "R_byte-length_in", which an event "I2C_AAA_READ_INFO" can take as shown by a symbol 15a' are combined, are generated as a verification item at each combination among 65536 kinds of combinations for signals, "W_ADD_EXPECT_in" and "W_DATA_EXPECT_in", which an event "I2C_AAA WRITE_INFO" can take.

Here, all combinations of signals "R_ADD_EXPECT_in", "R_DATA_in", and "R_bytelength_in" are shown, for simplification of the drawing, only for a case in which a "W_ADD_EXPECT_in" signal and a "W_DATA_EXPECT_in" signal are "0", respectively, where the signals "R_ADD_EXPECT_in", "R_DATA_in", and "R_byte-length_in" are signals which an event "I2C_AAA_READ_INFO" shown by a symbol 15a' in FIG. 13 can take. However, combinations shown by a symbol 15a' are actually made, corresponding to each of 65536 kinds of combinations of "W_ADD_EXPECT_in" signals and "W_DATA_EXPECT_in" signals.

Moreover, the verification items for the combinations of "No. 3-7" in the test bench combination list 10a (FIG. 10) has been eliminated for simplification of the drawing in the verification items 15a shown in FIG. 13

The scenario generation unit 16 generates a verification scenario, based on a scenario template generated by the scenario template generation unit 13, and verification items generated by the verification item generation unit 15.

Specifically, the scenario generation unit 16 automatically generates the verification items by adding each verification item generated by the verification item generation unit 15 to the scenario template generated by the scenario template generation unit 13.

Figure 14:
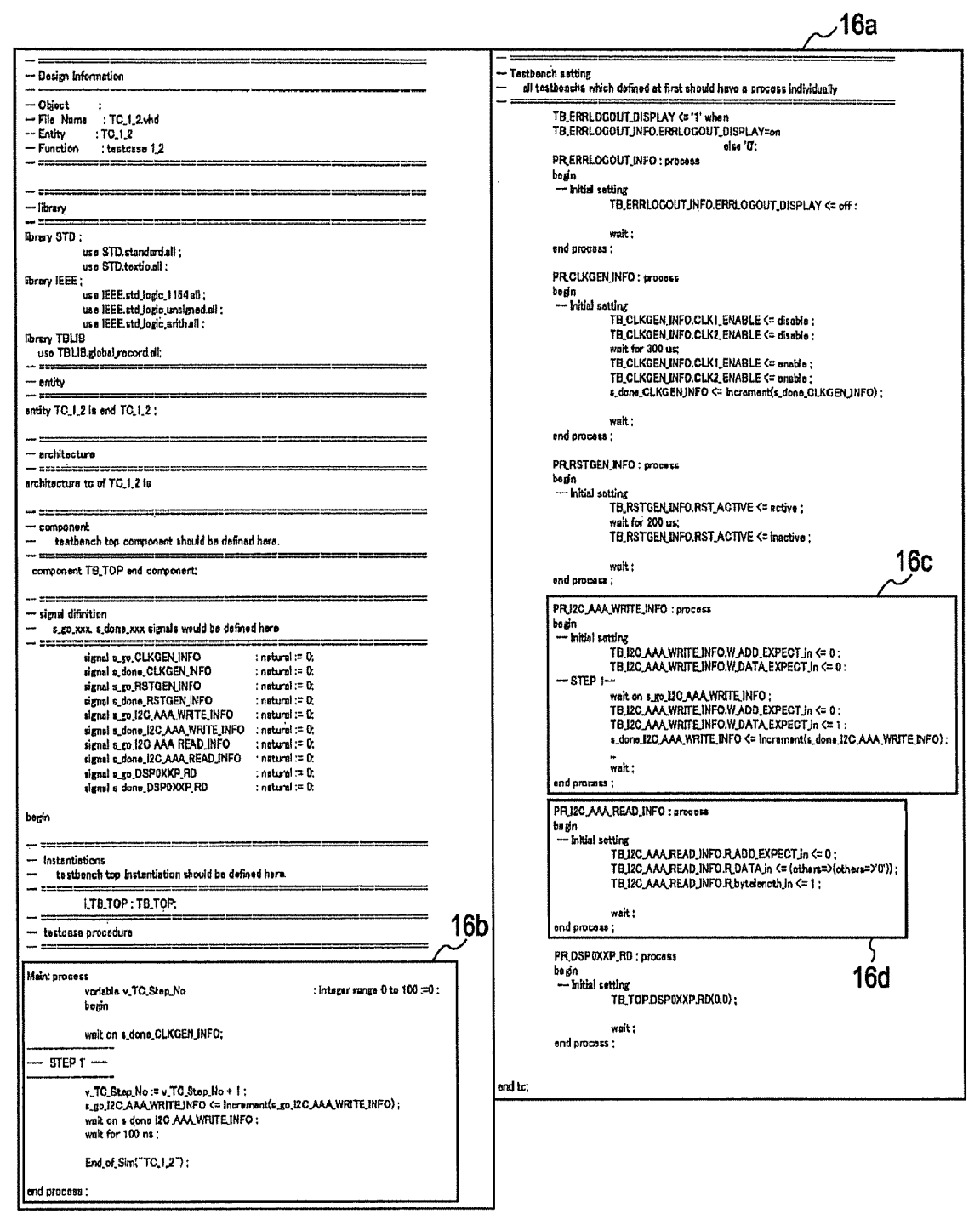

For example, the scenario generation unit 16 generates the verification scenario 16a shown in FIG. 14. In the above verification scenario 16a, chiefly, portions shown by symbols 16b, 16c, and 16d are changed according to the verification items 15a.

That is, the scenario generation unit 16 realizes generation of test patterns for each function, based on the verification scenario, by burying set data to the test bench onto the template specified by one verification item in verification items 15a. The scenario generation unit 16 generates scenario groups by executing the above processing for all combinations in verification item 15a.

The circuit information holding unit 17 holds circuit information on the circuit to be verified.

The verification unit 18 verifies (logically verifies) the circuit to be verified, based on the scenario generated by the scenario generation unit 16. Specifically, the circuit information on the circuit to be verified is read from the circuit information holding unit 17 to execute a simulation of the circuit to be verified, using scenario groups generated by the scenario generation unit 16. Then, success or failure of the simulation result (that is, whether the circuit to be verified is normally operated, or not) is verified.

Here, simulation results by the verification unit 18 are output in a log file, and a wave shape file (refer to the above-described drawing FIG. 5).

Moreover, the verification unit 18 functions as an assertion verification unit for executing assertion verification of the circuit to be verified, using the assertion group generated by the test bench generation unit 12.

A verification according to the disclosed method will be explained, referring to a flow diagram (operations S10-S18) shown in FIG. 15. Here, processing pertaining to operations S10-S16 functions as a method for generating the verification scenario according to one embodiment of the present invention.

In the first place, the first input unit 10 accepts or receives (operation S10) input of a device list, device parameter setting information, and a test bench combination list, which are generated by a user (operator).

Figure 15A:
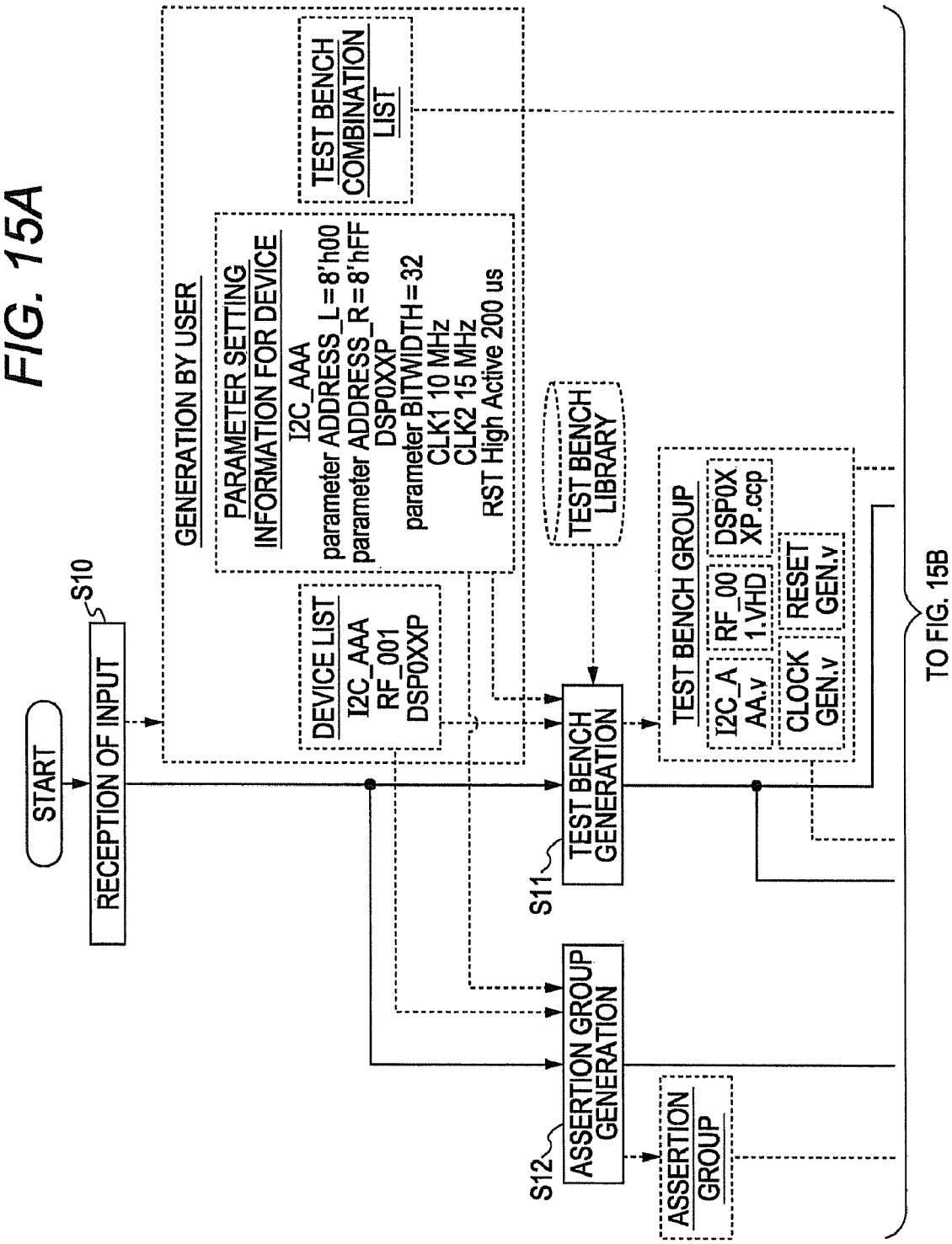
FIGS. 15A and 15B show an operation procedure illustrating a verification method according to the embodiment of the invention.

Here, input of the device list including model numbers "I2C_AAA", "RF_001", and "DSP0XXP" is accepted or received by the first input unit 10 as shown in FIG. 15. Input of "parameter ADDRESS_L=8'h00", and "parameter ADDRESS_R=8'hFF" are accepted as parameter setting information for a model number "I2C_AAA". Input of "parameter BITWIDTH=32", "CLK1 10 MHz", "CLK2 15 MHz", and "RST High Active 200 us" is accepted as parameter setting information for a model number "DSP0XXP". Input of the test bench combination list 10a shown, for example, in FIG. 10 is accepted as a test bench combination list.

Then, the test bench generation unit 12 reads a test bench from the test bench library 11, based on the device list and the parameter setting information input from the outside, to generate a test bench for verification (test bench generation operation for verification; operation S11).

Here, test benches "I2C_AAA.v", "RF_001.VHD", "DSP0XXP.ccp", "CLOCKGEN.v", and, "RESETGEN.v" are generated by test bench generation unit 12 as shown in FIG. 15.

Moreover, the test bench generation unit 12 reads an assertion group for a protocol of the test bench from the test bench library 11, based on the device list and the parameter setting information, and an assertion group corresponding to the test bench for verification is generated (assertion group generation operation; operation S12).

Then, the scenario template generation unit 13 generates a scenario template in which initial setting information for the test bench for verification generated by the test bench generation unit 12 is described (scenario template generation operation; operation S13).

Figure 15B:
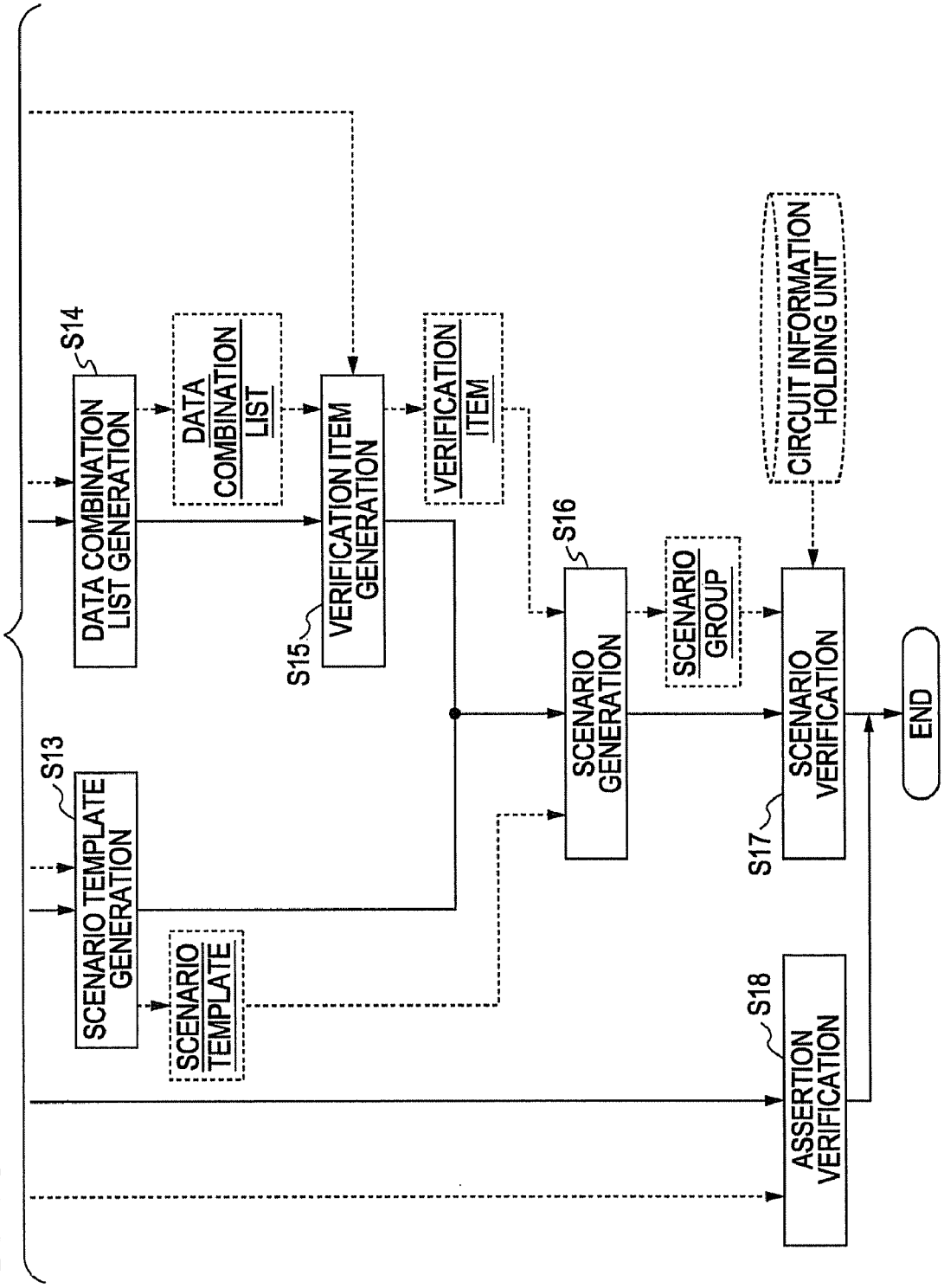

Moreover, in parallel with processing the above-described operation S13, the data combination list generation unit 14 generates a combination list for data kinds according to the test bench for verification generated by the test bench generation unit 12 (data combination list generation operation; operation S14 in FIG. 15B).

Subsequently, the verification item generation unit 15 generates a verification item, based on the combination list of the data kinds generated by the data combination list generation unit 14, and the combination list of test benches input from the outside (verification item generation operation; operation S15).

Then, the scenario generation unit 16 generates a verification scenario (denoted as a scenario group in the drawing), based on the scenario template generated by the scenario template generation unit 13, and the verification items generated by the verification item generation unit 15 (verification scenario generation operation; operation S16).

Finally, the verification unit 18 reads circuit information on the circuit to be verified from the circuit information holding unit 17, and performs simulation, based on the scenario group generated by the scenario generation unit 16. Then, based on the simulation result, it is verified whether the circuit to be verified operates normally or not (verification operation; operation S17).

On the other hand, in parallel with processing the above-described operation S17 processing, the verification unit 18 executes assertion verification of the circuit to be verified (assertion verification operation; operation S18), based on the assertion group generated by the test bench generation unit 12, and the processing is completed.

Thus, according to the disclosed verification device 1 and the verification method, the first input unit 10 accepts input of a device list, parameter setting information, and a combination list of the test benches; the test bench generation unit 12 reads the test bench from the test bench library 11, based on the device list and the parameter setting information; the test bench for verification is generated (test bench generation operation for verification), and the scenario template generation unit 13 generates a scenario template describing initial setting information of a test bench for verification (scenario template generation operation).

Further, the data combination list generation unit 14 generates the combination list of data kinds according to a test bench for verification (data combination list generation operation); the verification item generation unit 15 generates verification items, based on a combination list of data kinds, and a combination list of the test benches (verification item generation operation); and, finally, the scenario generation unit 16, based on the scenario template and the verification item, generates the verification scenario (verification scenario generation operation). Accordingly, a verification scenario (scenario group) used for logic verification of integrated circuit verification may be automatically generated only by input of the device list, the parameter setting information, and the combination list of the test benches to greatly decrease the operator load, and, at the same time, a time for creating or preparing a verification scenario is remarkably reduced in comparison with that of hand work by an operator.

Moreover, absence of verification scenario is controlled by automatic generation of the verification scenario. Moreover, as the verification scenario for all patterns of data communication is generated, the verification covering performance is improved and does not require the need to remake a verification scenario.

Moreover, as the test bench library 11 holds a test bench for a basis of the test bench for verification, general use of a test bench held in the test bench library 11 may be realized.

That is, the test bench generation unit 12 converts a test bench in the test bench library 11 into a test bench for verification, based on the device list and the parameter setting information. Accordingly, a test bench in the test bench library 11 as a base of a test bench for verification may be generally used.

Here, the present invention is not limited to the above-described embodiment, and various kinds of modifications may be possible without departing from the scope of the present invention.

For example, in the above-description, there have been explained a case in which the first input unit 10 accepts input of the device list, the parameter setting information, and test bench combination list. But, the present invention is not limited to the above case, and there may be another configuration, in which, for example, as shown in FIG. 1, a first input unit 10' in a verification device 1' (verification scenario generation device 2') may be configured to accept input of a test bench expectation value list, other than a device list, a parameter setting information, and a test bench combination list.

Here, the test bench expectation value list is a list of expectation values for test benches with an expectation value collation function (for example, the task name of a test bench with a model number "DSP0XXP" shown in FIG. 10 is "task RD_VERIFY").

Figure 16A:
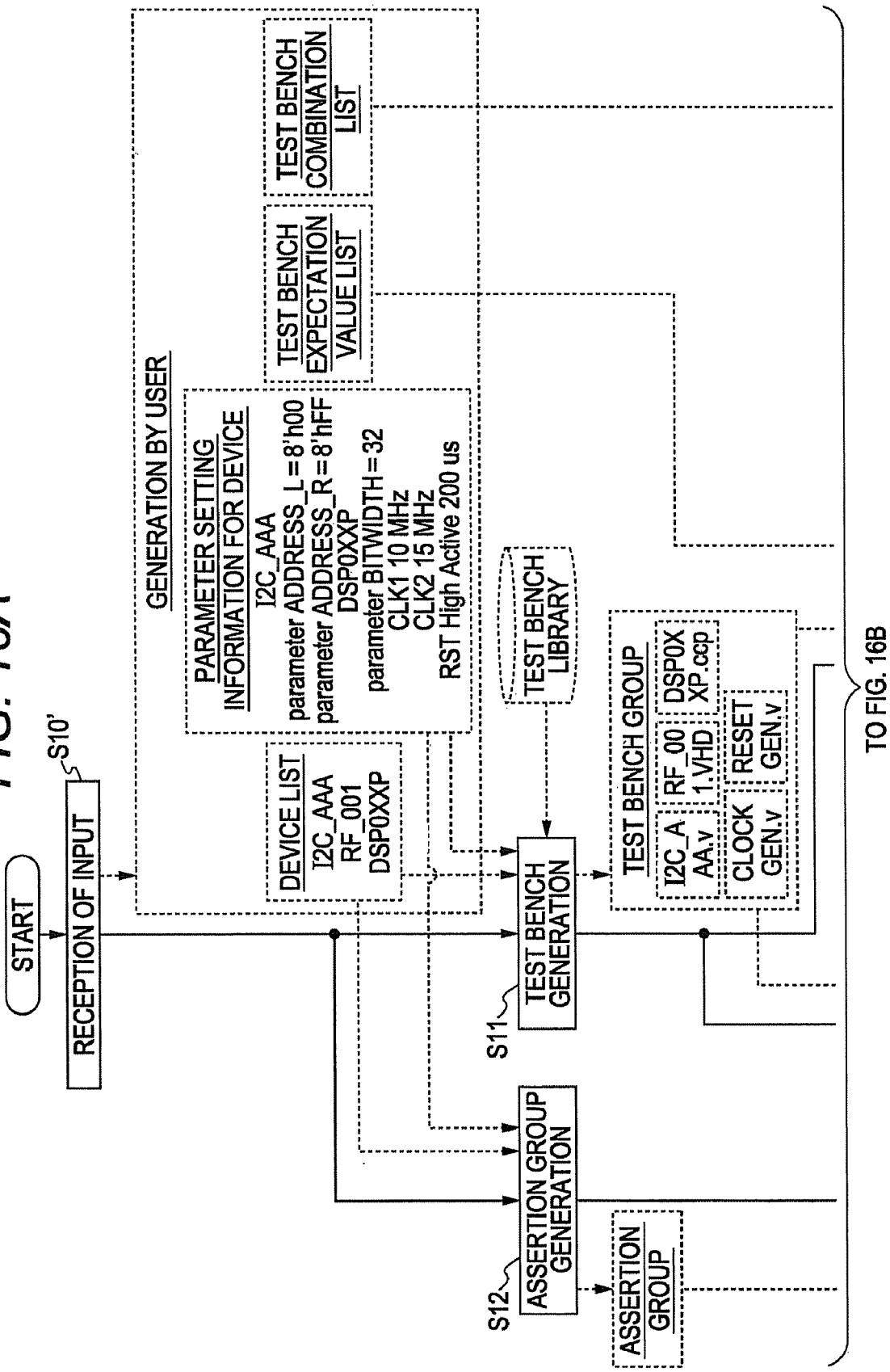
FIGS. 16A and 16B show an operation procedure illustrating a verification device according to a first modification of the invention.
Figure 16B:
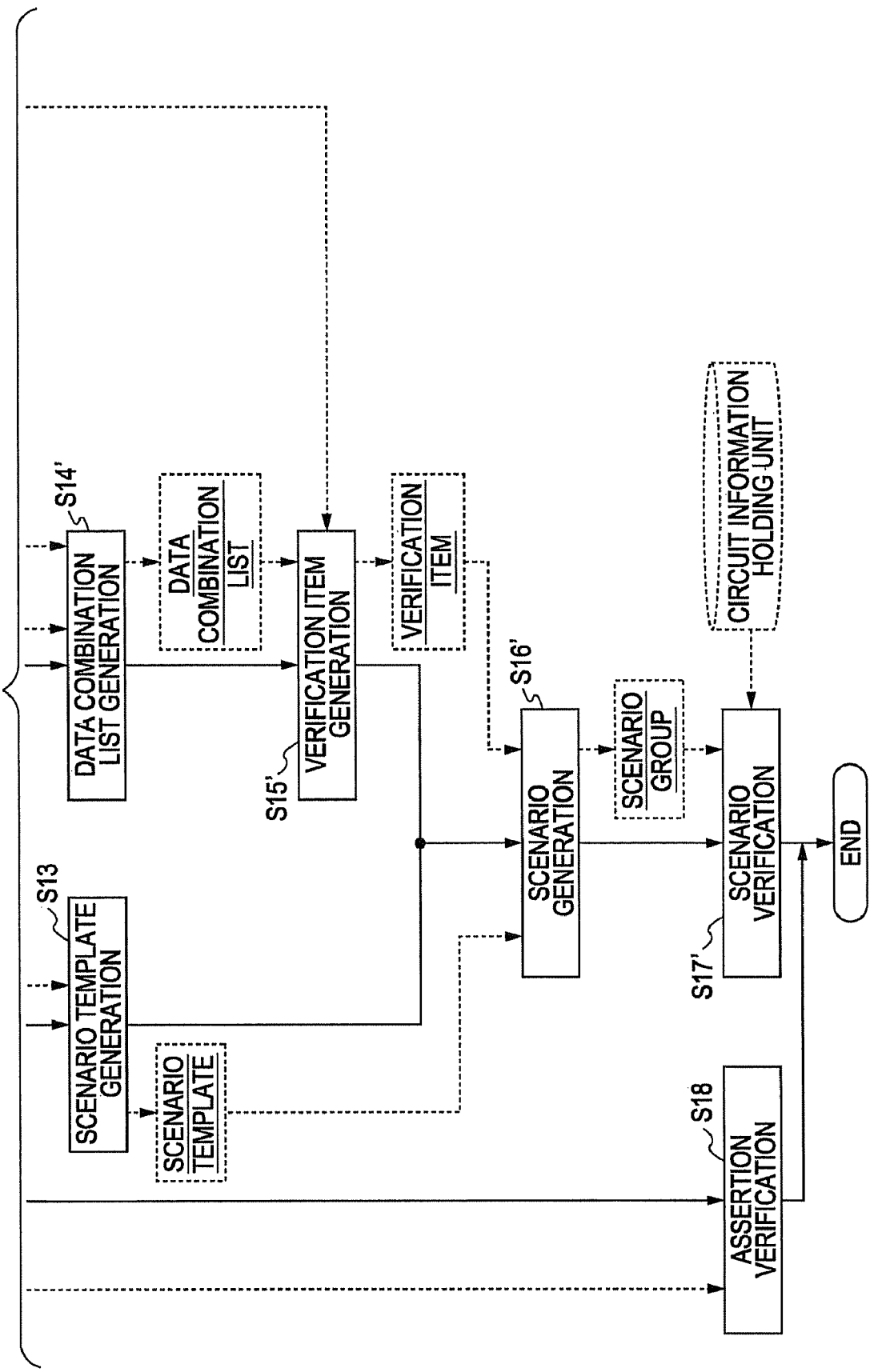
Figure 18:
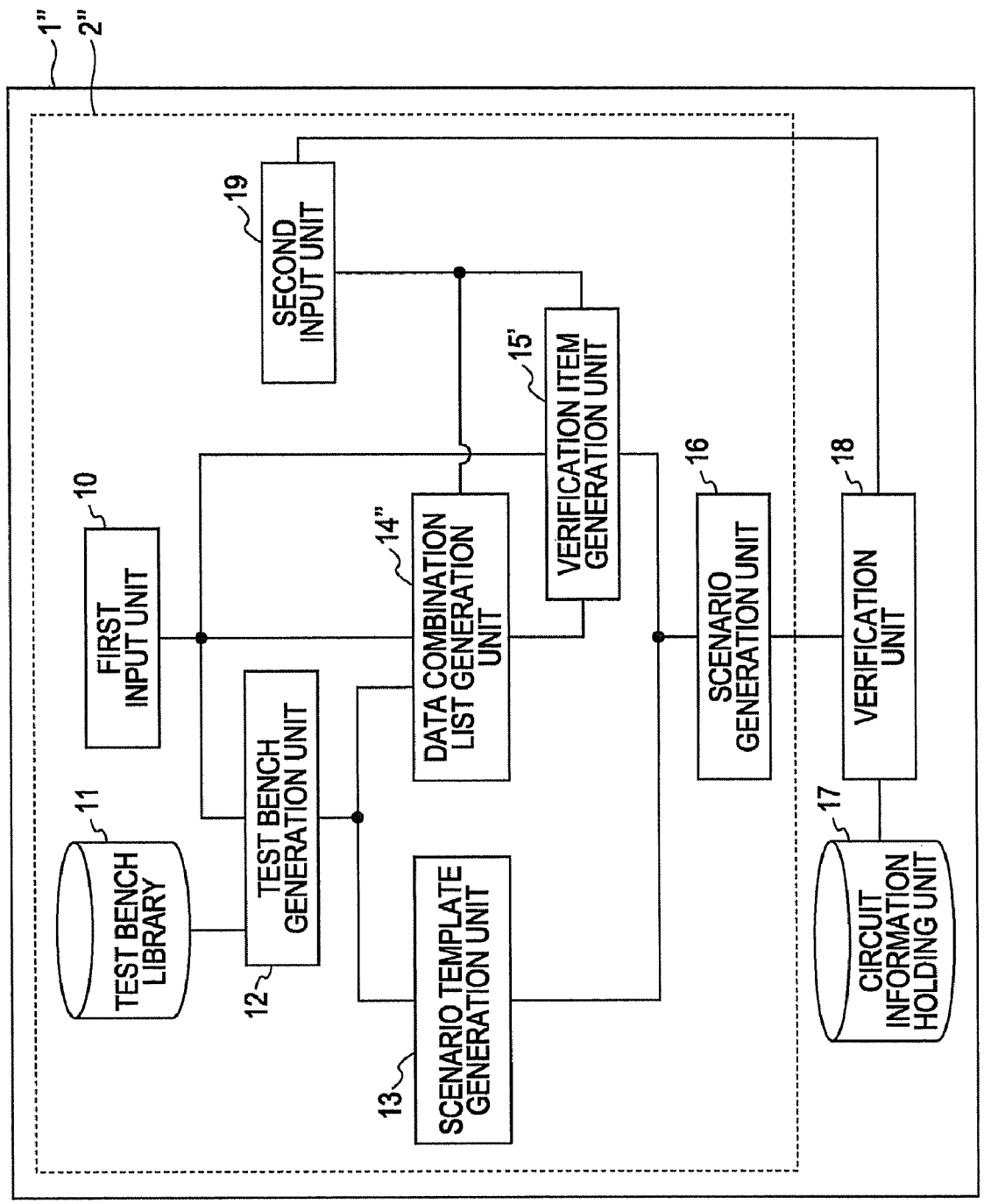
FIG. 18 is a block diagram illustrating a verification device according to a second modification of the invention.

Then, as shown in a flow diagram (operations S10', S11 to S13, S14' to S17', and S18) indicating an operation procedure (that is, an operation procedure for the disclosed verification method) for the verification device 1' shown in FIG. 16, the first input unit 10' accepts the input of the test bench expectation value list (operation S10'), the test bench generation unit 12 generates a test bench (operation S11), the data combination list generation unit 14' generates a data combination list (operation S12'), including the expectation value list, the input of which is accepted by the first input unit 10', in the data combination list.

Here, operations S10', S11 to S13, and S14' to S16' in FIG. 16 function as a method for generating a verification scenario. At the same time, the detailed explanation will be eliminated here because the same symbols as the aforementioned symbols in FIG. 16 indicate the same processing as the aforementioned processing, or almost the same processing.

More specifically, in the above-described operation S12', the data combination list generation unit 14' generates a data combination list 14d including the list of expected data (noted as "expected_data" in the drawing) in a signal with a task name of "task RD_VERIFY" having a test bench of model number "DSP0XXP" (here, in the "signal 3" column), based on the expectation value list as shown in FIG. 17.

Then, a verification item generation unit 15' generates verification items (operation S15'), based on a data combination list 14d. Then, the scenario generation unit 16 generates a scenario related to a task name "task RD_VERIFY" for a test bench with a model number "DSP0XXP", including an expectation value (operation S16'). The verification unit 18 collates an expectation value (operation S17') for a scenario related to a task name "task RD_VERIFY", based on the expectation value.

As described above, according to the verification device 1' (verification scenario generation device 2') and the verification method, the same operation advantage as that of the above-described embodiment may be obtained. Furthermore, when the first input unit 10' accepts the input of an expectation value list, the data combination list generation unit 14' generates a data combination list 14d including the expectation value. As a result, a scenario generation unit 16' generates a scenario including the expectation value. Thereby, a verification unit 18' executes expectation value collation using the expectation value. Therefore, the expectation value collation may be surely executed when the operator only inputs the expectation value list.

Moreover, a case in which the first input unit 10 accepts input of a device list, a parameter setting information, and, a test bench combination list has been explained in the above described embodiment, but the present invention is not limited to the above configuration. For example, it is acceptable to provide a configuration in which, a verification device 1" (verification scenario generation device 2") as a second modification of the present invention is provided with a second input unit 19 through which a coverage result output as a simulation result by a verification unit 18 is input to a data combination list generation unit 14" and the verification item generation unit 15'.

Here, the coverage result shows whether simulation which passes all lines of [RTL] of the circuit to be verified is executed or not. That is, it is shown whether scenario verification covering all patterns of data communication related to RTL of the circuit to be verified has been able to be executed, and, at the same time, RTL lines (functions) which are not able to be verified are displayed when all the RTL may not be covered.

Figure 19:
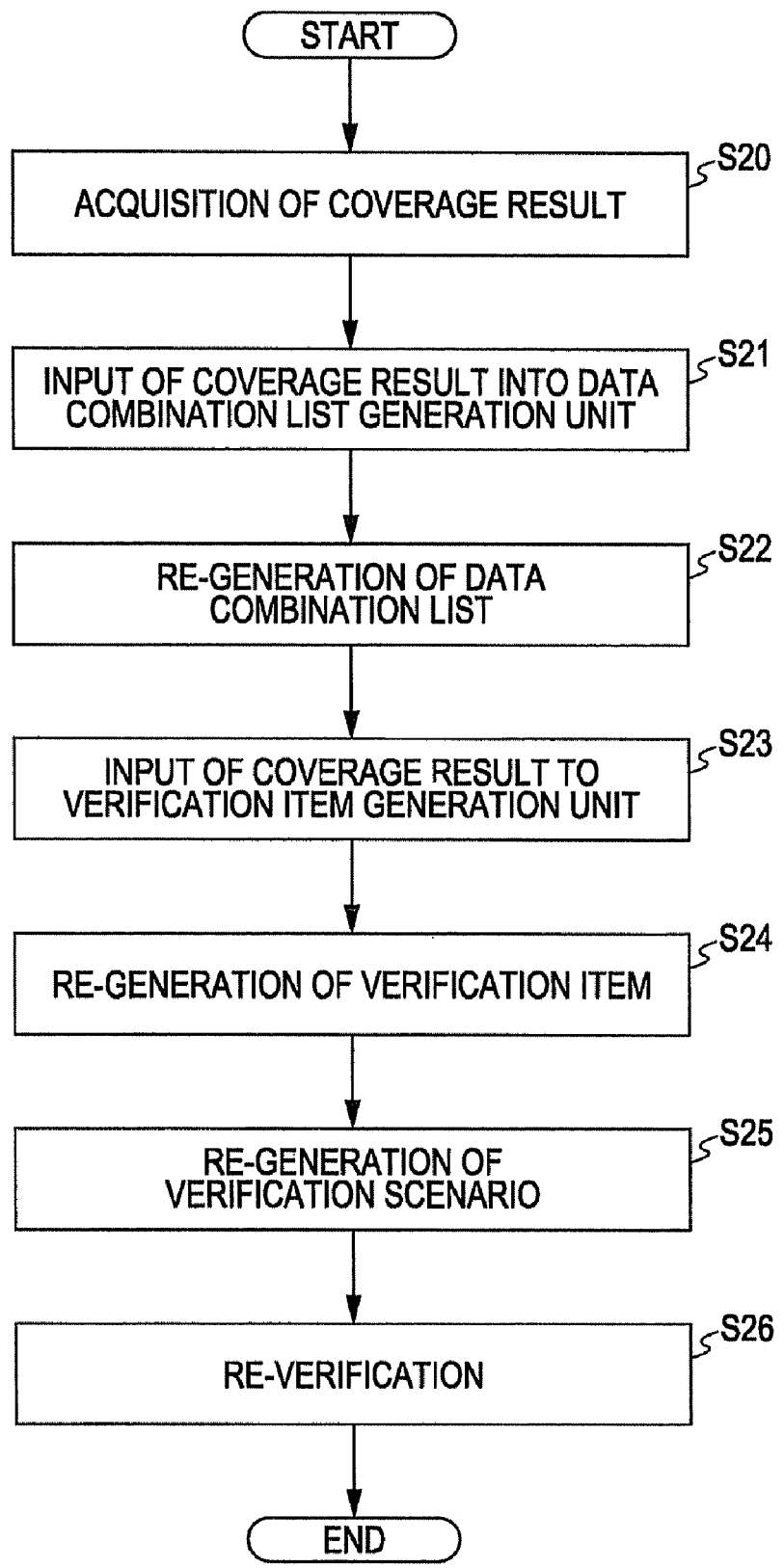
FIG. 19 shows an operation procedure related to a coverage result in a verification device according to the second modification of the invention.
Figure 20:
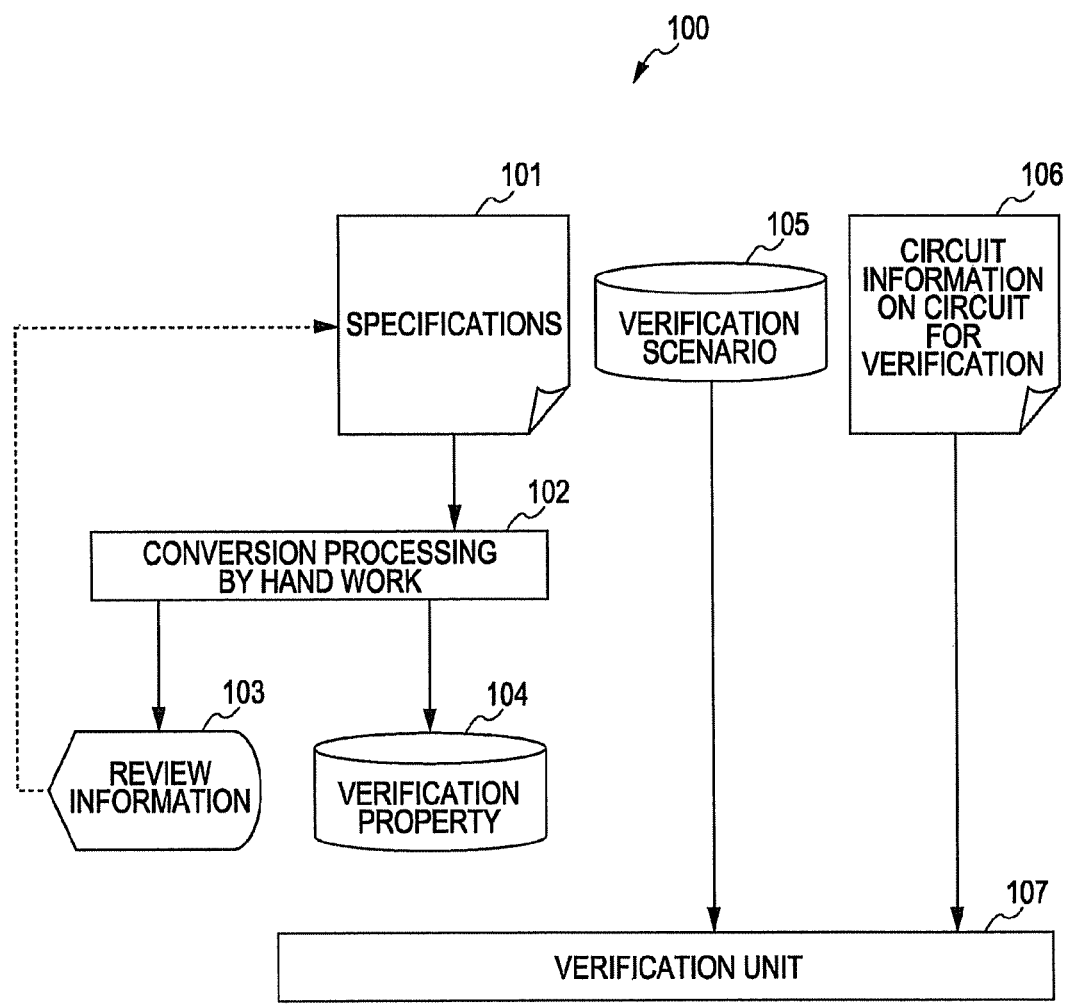
FIG. 20 shows a typical verification system of an integrated circuit.

Then, in the first place, the above-described operations S10-S17 in the flow diagram shown in FIG. 15 are executed, as shown in a flow diagram (operation S20-S26) indicating the operation procedure (that is, an operation procedure for the verification method according to the second modification of the present invention) of the verification device 1" shown in FIG. 19. Thereby, the second input unit 19 acquires the coverage result obtained as a simulation result of the scenario verification by the verification unit 18 (coverage result acquisition operation; operation S20).

Then, the second input unit 19 inputs the acquired coverage result into the data combination list generation unit 14" (operation S21), and the data combination list generation unit 14" regenerates a combination list of data kind, based on the input coverage result (data combination list re-generation operation; operation S22).

That is, the data combination list generation unit 14" regenerates a data combination list for verifying units in which the last scenario verification has not been executed, based on the coverage result.

Subsequently, the second input unit 19 inputs the coverage result to the verification item generation unit 15' (operation S23). The verification item generation unit 15' regenerates verification items, based on the input coverage result (verification item re-generation operation; operation S24).

Here, the verification item generation unit 15' regenerates verification items to verify the portion in which the last scenario verification has not been executed, based on the coverage result.

Then, the scenario generation unit 16 regenerates a verification scenario for verifying the RTL lines which has not been able to be verified at the last scenario verification, corresponding to the coverage results, based on the scenario template and the verification items regenerated at the above-described operation S24 (verification scenario re-generation operation; operation S25).

Finally, the verification unit 18 re-verifies the circuit to be verified (re-verification operation; operation S26), based on the verification scenario which the scenario generation unit 16 has regenerated to terminate the processing.

As described above, according to the verification device 1" (verification scenario generation device 2") and the verification method disclosed, the data combination list generation unit 14" regenerates the data combination list, based on a coverage result obtained as a result of simulation by the verification unit 18. Then, the verification item generation unit 15' regenerates the verification items, and, at the same time, the scenario generation unit 16 regenerates the scenario, based on these regenerated data combination list and verification items. Accordingly, a verification scenario which executes simulation of portions which have not been able to be simulated at the last simulation is generated.

Then, verification leakage of RTL of the circuit to be verified may be surely prevented, because verification of the circuit to be verified, using the verification scenario according to the coverage results, by the verification unit 18 has been regenerated. Thereby, verification coverage may be improved, and, accordingly, the accuracy in simulation and in verification may be improved.

Here, in the present invention, a kind and a number of devices, input of which are accepted or received by the first input units 10 and 10' in a device list, a kind and a number of parameter setting information, a number of test bench combination lists, and the like are not limited, and are variously changed according to a circuit to be verified.

Here, though the second input unit 19 in the above-described verification device 1" has been explained from simulation results by the verification unit 18, in which the coverage is automatically acquired as one example, the present invention is not limited to this one. For example, the second input unit 19, as well as the first input unit 10, may be realized by the keyboard 32, the mouse 33, and an arithmetic unit (input control unit) 34, which are shown in the above-described FIG. 2. Moreover, it is acceptable to have a configuration in which, while an operator refers to the simulation result, coverage results are configured to be input by hand work.

Here, there is acceptable another configuration in which the functions of the above-described first input units 10 and 10', the test bench generation unit 12, the scenario template generation unit 13, the data combination list generation unit 14, 14', and 14", the verification item generation units 15 and 15' the scenario generation unit 16 and 16', the verification unit 18 and 18', and the second input unit 19 are allowed to be realized by a configuration in which a computer (including a CPU, an information processor, and various terminals) executes predetermined application programs (verification programs, or a verification scenario generation program).

The above discussed programs may be provided in the form of computer-readable recording medium such as a Flexible disk, a CD (CD-ROM, CD-R, and CD-RW, etc.), a DVD (DVD-ROM, DVD-RAM, DVD-R, DVD-RW, DVD+R, and DVD+RW, and the like) and the like. In this case, the computer reads a verification program or a verification scenario generation program from the recording medium for forwarding to, and storing in an internal storage device or an external storage device. Moreover, the above programs are recorded in a storage device such as a magnetic disk, an optical disk, and a magnet-optical disks (recording medium), and are provided from the storage device to the computer through a communication line.

Here, the computer is a concept including hardware and OS (operating system), including hardware working under the control of OS. Moreover, when OS is not required, and hardware is operated only by application programs, the hardware may correspond to the described computer. Hardware is provided at least with a microprocessor such as CPU, and is provided with a capability of reading computer programs recorded in the recording medium.

The application program as the above-described verification program includes program codes for realizing the functions of first input units 10 and 10', a test bench generation unit 12, a scenario template generation unit 13, data combination list generation units 14, 14', and 14'', verification item generation units 15 and 15', scenario generation units 16 and 16', verification units 18 and 18', and a second input unit 19 in the above-described computers. Moreover, it is acceptable that a part of the functions is allowed to be realized not by application programs, but by OS. Moreover, the application programs as the above-described verification scenario generation programs includes program codes by which the above described computer realizes the functions of the following units: the first input units 10 and 10'; the test bench generation unit 12; the scenario template generation unit 13; the data combination list generation units 14, 14', and 14''; the verification item generation units 15 and 15'; the scenario generation unit 16 and 16': and the second input unit 19. Moreover, a part of the functions is allowed to be realized not by application programs, but by OS.

Here, the recording medium in this embodiment may use various kind of computer-readable recording medium such as: the above described flexible disk, a CD, a DVD, a magnetic disk, an optical disk, and a magnet-optical disk, an IC card, a ROM cartridge, a magnetic tape, a punched card, an internal storage device of a computer (memories such as RAM and ROM), an external memory device, and a printed matter with a symbol such as a bar code, and the like.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A verification scenario generation device, comprising:
 a first input unit receiving an input of a device list indicating devices connected with a circuit to be verified, parameter setting information of the devices, and a test bench combination list corresponding to the devices;
 a test bench library containing the test bench combination list;
 a test bench generation unit generating a test bench for verification by reading from the test bench library based on the device list and the parameter setting information received by the first input unit;
 a scenario template generation unit generating a scenario template in which an initial setting information for the test bench for verification is described;
 a data combination list generation unit generating a combination list of data kinds related to the test bench for verification;
 a verification item generation unit generating verification items based on the combination list of the data kind generated and a combination list of the test bench input received by the first input unit;
 a verification scenario generation unit generating a verification scenario based on the scenario template generated, and the verification items generated; and
 a second input unit inputting a coverage result output as a result of simulation using the verification scenario generated into the data combination list generation unit and the verification item generation unit, and
 wherein the data combination list generation unit reproduces a combination list of the data kinds based on the coverage result input by the second input unit,
 the verification item generation unit reproduces the verification item based on the coverage result input by the second input unit, and
 the verification scenario generation unit regenerates a verification scenario corresponding to the coverage result based on the data kind combination list regenerated, and the verification item regenerated.

2. The verification scenario generation device according to claim 1, wherein the test bench generation unit generates the test bench for verification by reading a test bench corresponding to device indicated by the device list from the test bench library, and by setting parameters the test bench based on the parameter setting information.

3. The verification scenario generation device according to claim 1, wherein the first input unit receives an input of an expectation value list of a test bench, and
 the data combination list generation unit includes the expectation value list in the combination list for the data kinds.

4. The verification scenario generation device according to claim 1, wherein the test bench library is configured to hold an assertion group of protocols for test benches, and
 the verification scenario generation device comprises:
  an assertion group generation unit generating assertion groups corresponding to the test benches for verification by reading assertion group from the test bench library based on the device list, and the parameter setting information input via the first input unit.

5. A computer-implemented method for generating a verification scenario, comprising:
 generating a test bench for verification by reading from a test bench library holding the test bench, the test bench for verification being generated based on a device list indicating devices input from an outside, and connected with a circuit to be verified and parameter setting information for the device;
 generating a scenario template describing initialization setting information for the test bench for verification generated;
 generating a combination list for data kinds related to the test bench for verification generated;
 generating verification items based on a combination list for the data kinds generated and a combination list of test benches corresponding to the device input from the outside;
 generating a verification scenario based on the scenario template generated and the verification items generated;
 acquiring a coverage result output as a simulation result using the verification scenario generated;
 regenerating a data combination list of the data kinds based on the coverage result acquired;
 regenerating the verification items based on the coverage result acquired; and
 regenerating a verification scenario corresponding to the coverage result based on the combination list of the data kinds regenerated, and the verification items regenerated.

6. The method for generating a verification scenario according to claim 5, wherein a test bench for verification is generated by reading a test bench corresponding to device indicated by the device list from the test bench library, and by setting parameters for the read test bench based on the parameter setting information.

7. The method for generating a verification scenario according to claim 5, wherein an expectation value list for test benches input from the outside is included in the combination list of data kinds.

8. The method for generating a verification scenario according to claim 5, comprising:
 generating an assertion group generation by reading assertion group according to a protocol of the test bench from the test bench library based on the device list and the parameter setting information, which are input from the outside.

9. A computer readable storage medium storing a verification scenario generation program to cause a computer to execute operations including a verification scenario of a circuit to be verified, comprising:
receiving an input of a device list representing devices connected with the circuit to be verified, device parameter setting information of the devices, and a combination list for test benches corresponding to the devices;
generating a test bench for verification based on the device list and the parameter setting information the input by reading from a test bench library;
generating a scenario template in which initialization setting information on the test bench for verification is described;
generating a data combination list for data kinds related to a test bench for verification;
generating verification items based on a combination list of the data kinds and based on a combination list of the test benches input; and
generating a verification scenario based on the scenario template generated and based on the verification item generated;
coverage result output as simulation result using the verification scenario generated is input into the data combination list and the verification item,
the data combination list based on the coverage result is used to regenerate a combination list of the data kinds,
the verification item is regenerated based on the coverage result input, and
a verification scenario corresponding to the coverage result is regenerated based on the data kind combination list regenerated, and the verification item regenerated.

10. The computer readable storage medium according to claim 9, wherein the test bench generation includes reading a test bench corresponding to device indicated by the device list from the test bench library, and generates the test bench for verification by setting a parameter of the read test bench based on the parameter setting information.

11. The computer readable storage medium according to claim 9, wherein an expectation value list for a test bench is input, and
the data combination list includes the expectation value list.

12. The computer readable storage medium according to claim 9, wherein based on the device list and the parameter setting information, an assertion group having a protocol of the test bench is read from the test bench library, and assertion group corresponding to the test bench for the verification is generated.

13. A verification device, comprising:
a first input unit receiving an input of a device list indicating devices connected with a circuit for verification, parameter setting information of the device, and a combination list of test benches corresponding to the device;
a test bench library for verification containing the test benches;
a test bench generation unit generating a test bench for verification based on the device list and the parameter setting information, the test bench being read from the test bench library;
a scenario template generation unit generating a scenario template in which initialization setting information for the test bench for verification is described;
a data combination list generation unit generating a combination list for data kinds related to the test bench for verification;
a verification item generation unit generating a verification item based on the combination list for the data kinds generated, and a combination list of the test bench input;
a verification scenario generation unit generating a verification scenario based on the scenario template generated, and the verification item generated; and
a verification unit performing a verification of the circuit to be verified based on the verification scenario generated,
a second input unit inputting a coverage result output as a simulation result using the verification scenario generated by the verification scenario generation unit into the data combination list generation unit, and the verification item generation unit, wherein
the data combination list generation unit regenerating a combination list of the data kind based on the coverage result input by the second input unit,
the verification item generation unit regenerating verification items based on the coverage result input by the second input unit, and
the verification scenario generation unit regenerating a verification scenario corresponding to the coverage result based on a combination list of the data kinds regenerated, and the verification item regenerated.

14. The verification device according to claim 13, wherein the test bench generation unit generates test bench for verification by reading a test bench corresponding to device indicated by the device list from the test bench library, and by setting parameters for read test bench, based on the parameter setting information.

15. The verification device according to claim 13, wherein the first input unit accepts an input of an expectation value list of a test bench,
the data combination list includes the expectation value list in a combination list of the data kinds, and
at verification, the verification unit performs expectation value collation based on the expectation value list.

16. The verification device according to claim 13, wherein the test bench library is configured to hold an assertion group according to a protocol of the test bench, and
the verification device comprises:
an assertion group generation unit in which, based on the device list and the parameter setting information input, assertion group is read from the test bench library, and assertion group corresponding to the test benches for verification is generated; and
an assertion verification unit performing assertion verification, using the assertion group generated by the assertion group generation unit.

* * * * *